United States Patent [19]
Ueda

[11] Patent Number: 5,808,346
[45] Date of Patent: Sep. 15, 1998

[54] SEMICONDUCTOR DEVICE STRUCTURE WHICH PROVIDES INDIVIDUALLY CONTROLLABLE BODY-TERMINAL VOLTAGE OF MOS TRANSISTORS

[75] Inventor: Kimio Ueda, Tokyo, Japan

[73] Assignee: Mitsubishi Denki Kabushiki Kaisha, Tokyo, Japan

[21] Appl. No.: 770,422

[22] Filed: Dec. 20, 1996

[30]    Foreign Application Priority Data

Jul. 18, 1996   [JP]   Japan ..................................... 8-189268

[51] Int. Cl.[6] .................................................. H01L 29/41
[52] U.S. Cl. ........................... 257/774; 257/347; 257/372
[58] Field of Search .................................. 257/774, 547, 257/903, 393, 347, 372

[56]              References Cited

U.S. PATENT DOCUMENTS

| 5,014,109 | 5/1991 | Higuchi | 257/774 |
| 5,498,882 | 3/1996 | Houston | 257/372 |
| 5,559,368 | 9/1996 | Hu et al. | 257/369 |
| 5,619,072 | 4/1997 | Mehta | 257/774 |

FOREIGN PATENT DOCUMENTS 1 274450   11/1989   Japan .

OTHER PUBLICATIONS

1994 IEEE, IEDM, pp. 809–812, 1994, Fariborz Assaderaghi, et al., "A Dynamic Threshold Voltage MOSFET (DTMOS) for Ultra–Low Voltage Operation".

1996 IEEE International Solid–State Circuits Conference, pp. 84–85, 1996, Takakuni Douseki, et al., "A 0.5V Simox–MTCMOS Circuit With 200ps Logic Gate".

1995 IEEE International Solid–State Circuits Conference, pp. 88–89, 1996, Tsuneaki Fuse, et al., "0.5V SOI CMOS Pass–Gate Logic".

*Primary Examiner*—David B. Hardy
*Attorney, Agent, or Firm*—Oblon, Spivak, McClelland, Maier & Neustadt, P.C.

[57]              ABSTRACT

An N-type well region (NW) is provided on a P-type bulk silicon substrate (PS), and a channel region (PC) is provided inside the N-type well region (NW). The channel region is formed of a semiconductor layer having a polarity opposite to that of a source region (ST) and a drain region (DT). A contact hole (CHC) is provided in a gate oxide film (GO) located below a main portion (MP) close to an end portion (EP) of a gate electrode (GT). With this construction, a semiconductor device in which a body terminal is connected to a gate terminal for fast operation can remove restriction on location for connecting the body terminal and the gate terminal to achieve size-reduction and overcome disadvantages due to restriction on supply voltage.

19 Claims, 23 Drawing Sheets

SEMICONDUCTOR DEVICE STRUCTURE WHICH PROVIDES INDIVIDUALLY CONTROLLABLE BODY-TERMINAL VOLTAGE OF MOS TRANSISTORS

BACKGROUND OF THE INVENTION

1. Field of the Invention

The present invention relates to a semiconductor device, and more particularly to a semiconductor device in which the body-terminal voltage of MOS transistor is individually controllable.

2. Description of the Background Art

Recent studies for speeding up a switching operation with an increase of ON-state current (drain-to-source current) of MOS transistor by connecting a body terminal to a gate terminal are shown, for example, in IEDM (International Electron Devices Meeting), 1994, pp. 809–812 (hereinafter referred to as Document 1), ISSCC (IEEE International Solid-State Circuits Conference), 1996, pp. 84–85 (hereinafter referred to as Document 2) and pp. 88–89 (hereinafter referred to as Document 3).

Referring to FIGS. 53 to 56, an operation of the MOS transistor in which the body terminal is connected to the gate terminal will be discussed below. In FIG. 53 illustrating an NMOS transistor, reference characters GT, ST, DT and BT represent a gate terminal, a source terminal, a drain terminal and a body terminal, respectively. The body terminal BT is sometimes referred to as a back gate terminal.

In a conventional semiconductor integrated circuit, the body terminal BT of the NMOS transistor is connected to the source terminal ST, and when a voltage higher than a threshold voltage (Vth) is applied across the gate terminal and the source terminal, the NMOS transistor turns on to provide an ON-state current between the drain and source terminals.

FIG. 54 shows operating characteristics of the NMOS transistor, and specifically, drain-to-source terminal current (Ids) as a function of drain-to-source terminal voltage (Vds). In FIG. 54, two broken lines indicate drain-to-source terminal current characteristics BL1 and BL2 in application of voltages higher than the threshold voltage (Vth) across the gate and source terminals of NMOS transistor. The gate-to-source terminal voltage (Vgs) for the characteristic BL2 is higher than that for the characteristic BL1.

Two solid lines indicate drain-to-source terminal current characteristics SL1 and SL2 in a case where the body terminal is connected to the gate terminal. The gate-to-source voltage (Vgs) for the characteristic SL2 is higher than that for the characteristic SL1.

As can be seen from FIG. 54, a current flow increases as the gate-to-source terminal voltage (Vgs) rises, and the current flow in a case where the body terminal is connected to the gate terminal is larger than that in a case where the body terminal is connected to the source terminal.

Formula 1 indicates this phenomenon as below:

$$Ids \propto (Vgs-Vth)^2 \qquad (1)$$

Thus, the drain-to-source terminal current (Ids) increases as the gate-to-source terminal voltage (Vge) rises or the threshold voltage (Vth) drops. In a case of NMOS transistor, using the ground potential (GND) as the reference body-terminal voltage (back gate voltage), when the body-terminal voltage is made the back gate bias effect is reduced, and when the body-terminal voltage is made lower than the ground potential, the threshold voltage rises.

If the body terminal is connected to the gate terminal, when the gate terminal is given a predetermined voltage to turn the NMOS transistor on, the body-terminal voltage becomes equivalent to the gate-terminal voltage, i.e., higher than the ground potential and the threshold voltage drops, to increase the drain-to-source terminal current.

Conversely, in a case of PMOS transistor, as the body-terminal voltage is made lower than the source-terminal voltage, the back gate bias effect is reduced and accordingly the threshold voltage drops.

The semiconductor integrated circuit constituted of MOS transistors performs a logic operation through charging and discharging the load capacity. The MOS transistor in which the body terminal is connected to the gate terminal can produce a larger amount of drain-to-source terminal current, allowing a fast operation.

A problem rises as to the construction to connect the body terminal to the gate terminal. FIGS. 55 and 56 illustrate a connection between the body terminal and the gate terminal disclosed in Document 1.

FIG. 55 is a partial cross section of a semiconductor device. A polysilicon gate PG is provided above a P$^+$-type silicon region PR, and an aluminum layer AL is so provided as to penetrate the polysilicon gate PG to electrically short-circuit between the polysilicon gate PG and the P$^+$-type silicon region PR.

FIG. 56 is a plan view of the construction of FIG. 55 viewed from the direction of the arrow, omitting the aluminum layer AL. In FIG. 56, the polysilicon gate PG is interposed between N$^+$-type silicon regions NR which are to become drain and source regions, and the P$^+$-type silicon region PR is exposed in an end portion of the polysilicon gate PC located outside the N$^+$-type silicon regions NR. This portion corresponds to the construction of FIG. 55.

As above discussed, the connection between the gate terminal and the body terminal in the conventional MOS transistor is established with a conductor layer (aluminum layer AL) penetrating the gate to connect the gate and a semiconductor substrate immediately below the gate.

In this construction, the conductor layer (aluminum layer AL) must be formed so as to penetrate insulation layers above and below the gate, and therefore locational restriction and manufacturing difficulty should be considered.

Moreover, in the construction to connect the body terminal to the gate terminal, the supply voltage used therein must be lower than a built-in voltage (approximately 0.8V) of a diode consisting of a semiconductor layer (P-type silicon layer not shown in FIG. 55 or 56) to become a body region and a semiconductor layer (N$^+$-type silicon layer NR) to become a source region. That is because when a supply voltage higher than the built-in voltage, a parasitic bipolar transistor consisting of the semiconductor layer (N$^+$-type silicon region NR) to become the drain region, the semiconductor layer (N$^+$-type silicon region NR) to become the source region and the semiconductor layer to become the body region of the MOS transistor turns on and operates in a saturated region, causing a slower circuit-operation.

The present semiconductor device uses the supply voltage of 5V or 3.3V, and a semiconductor device in the future has a possibility of using the supply voltage of 1V. Practically, the supply voltage of 2.5V or 1.5V will be used.

In this situation, if the semiconductor device having the above construction can use only the supply voltage lower than 0.8V, it is disadvantageously difficult for this semiconductor device to coexist with other semiconductor devices using the supply voltage of 5V or 3.3V.

SUMMARY OF THE INVENTION

The present invention is directed to a semiconductor device. According to a first aspect of the present invention, the semiconductor device with MOS structure comprises: a semiconductor layer to be a channel region; a first oxide film to be a gate oxide film provided on the semiconductor layer; a gate electrode provided so that at least a portion thereof may be disposed on the first oxide film; and first connecting means provided between the gate electrode and the semiconductor layer, for electrically connecting the gate electrode and the semiconductor layer. In the semiconductor device of the first aspect, the first connecting means has a first contact hole provided so as to direct couple the gate electrode and the semiconductor layer; and a first conductor layer filling the first contact hole.

According to a second aspect of the present invention, in the semiconductor device of the first aspect, the first contact hole is so provided as to penetrate the first oxide film between the gate electrode and the semiconductor layer.

According to a third aspect of the present invention, the semiconductor device of the first aspect further comprises: a second oxide film provided on the semiconductor layer adjacently to the first oxide film, being thicker than the first oxide film, in which the gate electrode is provided so that most portion thereof may be disposed on the first oxide film and the remaining portion may be disposed on the second oxide film, and the first contact hole is provided so as to penetrate the second oxide film between the gate electrode and the semiconductor layer.

According to a fourth aspect of the present invention, a semiconductor device with MOS structure comprises: a first semiconductor layer to be a channel region; a second semiconductor layer provided adjacently to the first semiconductor layer, having a relatively high concentration and the same conductivity type as the first semiconductor layer; a first oxide film provided at least on the first semiconductor layer, to be a gate oxide film; a gate electrode provided on the first oxide film so that at least a portion thereof may be disposed on the first oxide film; and first connecting means provided between the gate electrode and the second semiconductor layer, for electrically connecting the gate electrode and the second semiconductor layer. In the semiconductor device of the fourth aspect, the first connecting means has a first contact hole provided so as to direct couple the gate electrode and the second semiconductor layer, and a first conductor layer filling the first contact hole.

According to a fifth aspect of the present invention, in the semiconductor device of the fourth aspect, the first oxide film is provided over the first semiconductor layer and the second semiconductor layer, and the first contact hole is provided so as to penetrate the first oxide film between the gate electrode and the second semiconductor layer.

According to a sixth aspect of the present invention, the semiconductor device of the fourth aspect further comprises: a second oxide film provided on the second semiconductor layer adjacently to the first oxide film, being thicker than the first oxide film, in which the gate electrode is provided so that most portion thereof may be disposed on the first oxide film and the remaining portion may be disposed on the second oxide film, and the first contact hole is provided so as to penetrate the second oxide film between the gate electrode and the second semiconductor layer.

According to a seventh aspect of the present invention, in the semiconductor device of the first or fourth aspect, the first conductor layer is made of the same material as the gate electrode.

According to an eighth aspect of the present invention, in the semiconductor device of the first or fourth aspect, the first conductor layer is made of a material different from that of the gate electrode.

According to a ninth aspect of the present invention, the semiconductor device of the first or fourth aspect further comprises: an insulation layer provided so as to cover the gate electrode; a wiring layer provided on the insulation layer; and second connecting means provided between the wiring layer and the gate electrode, for electrically connecting the wiring layer and the gate electrode. In the semiconductor device of the first or fourth aspect, the second connecting means has a second contact hole provided so as to direct couple the wiring layer and the gate electrode, and a second conductor layer filling the second contact hole, the gate electrode has an engagement portion to be engaged with the first contact hole which is wider than other portion, and the second contact hole is provided so as to penetrate the insulation layer, extending from a surface of the wiring layer to a surface of the engagement portion of the gate electrode which is opposite to that in engagement with the first contact hole.

According to a tenth aspect of the present invention, the semiconductor device with MOS structure of the first or fourth aspect is used for a gate-array semiconductor device. The gate-array semiconductor device includes a first array consisting of a plurality of MOS transistors of a first conductivity type in which gate electrodes of the plurality of MOS transistors of the first conductivity type are aligned in parallel, a second array consisting of a plurality of MOS transistors of a second conductivity type in which gate electrodes of the plurality of MOS transistors of the second conductivity type are aligned in parallel, and an isolation layer provided between the first array and the second array which are adjacent to each other, for electrically isolating the first and second arrays, and the first connecting means is provided for each of all the gate electrodes of the MOS transistors of the first conductivity type and the MOS transistors of the second conductivity type.

According to an eleventh aspect of the present invention, the semiconductor device with MOS structure of the first or fourth aspect is used for a gate-array semiconductor device. The gate-array semiconductor device includes a first array consisting of a plurality of MOS transistors of a first conductivity type in which gate electrodes of the plurality of MOS transistors of the first conductivity type are aligned in parallel, a second array consisting of a plurality of MOS transistors of a second conductivity type in which gate electrodes of the plurality of MOS transistors of the second conductivity type are aligned in parallel, a first isolation layer provided between the first array and the second array which are adjacent to each other, for electrically isolating the first and second arrays, and a second isolation layer for electrically isolating adjacent two of the MOS transistors of the first conductivity type and adjacent two of the MOS transistors of the second conductivity type, and the first connecting means is provided for each of all the gate electrodes of the MOS transistors of the first conductivity type and the MOS transistors of the second conductivity type.

According to a twelfth aspect of the present invention, the semiconductor device with MOS structure of the first or fourth aspect is used for data processing means for processing data externally given and data transmitting means electrically interposed between the data processing means and input/output means for inputting the data externally given and outputting data processed by the data processing means.

The data processing means and data transmitting means use a first voltage as an operating supply voltage which is lower than a built-in voltage of a parasitic diode caused by provision of the first connecting means, and the input/output means uses a second voltage as the operating supply voltage which is equal to or higher than the built-in voltage of the parasitic diode.

According to a thirteenth aspect of the present invention, the semiconductor device with MOS structure of the first or fourth aspect is used for an input/output gate of a semiconductor device which performs read/write operation of data through discharge/charge of capacitative elements.

In the semiconductor device of the first aspect, the first connecting means for electrically connecting the gate electrode and the semiconductor layer is provided between the gate electrode and the semiconductor layer, and the body is thereby connected to the gate electrode, allowing a fast operation. Moreover, since the gate electrode and the semiconductor layer are direct connected, the size of the transistor is reduced as compared with a construction in which the gate electrode is indirectly connected to the semiconductor layer with a dedicated semiconductor layer interposed therebetween.

In the semiconductor device of the second aspect, the first contact hole, which is provided so as to penetrate the first oxide film serving as a gate oxide film, has a shallow depth and is easily manufactured.

In the semiconductor device of the third aspect, the second oxide film which is thicker than the first oxide film is provided on the semiconductor layer adjacently to the first oxide film, and therefore the area of the first oxide film which defines capacitance of the gate is reduced. Accordingly, the time required for charge/discharge of capacitance of the gate is reduced, and the semiconductor device for faster operation can be provided.

In the semiconductor device of the fourth aspect, the first connecting means for electrically connecting the gate electrode and the second semiconductor layer is provided between the gate electrode and the second semiconductor layer, and the body is thereby connected to the gate electrode, allowing a fast operation. Moreover, since the gate electrode and the semiconductor layer are direct connected, the size of the transistor is reduced as compared with a construction in which the gate electrode is indirectly connected to the semiconductor layer with a dedicated semiconductor layer interposed therebetween. The first conductor layer is connected to the second conductor layer of relatively high concentration, and therefore the contact resistance on a contact surface is reduced, to speed up the switching operation of the transistor.

In the semiconductor device of the fifth aspect, the first contact hole, which is provided so as to penetrate the first oxide film serving as a gate oxide film, has a shallow depth and is easily manufactured.

In the semiconductor device of the sixth aspect, the second oxide film which is thicker than the first oxide film is provided on the semiconductor layer adjacently to the first oxide film, and therefore the area of the first oxide film which defines capacitance of the gate is reduced. Accordingly, the time required for charge/discharge of capacitance of the gate is reduced, and the semiconductor device for faster operation can be provided.

In the semiconductor device of the seventh aspect, the first conductor layer can be formed on forming the gate electrode in the same process step since the first conductor layer is made of the same material as the gate electrode, and the process of manufacturing the semiconductor device is thereby simplified.

In the semiconductor device of the eighth aspect, the first conductor layer is made of the material different from that of the gate electrode, and therefore, using a material which is helpful to reduce the contact resistance, a faster switching operation of the transistor is achieved.

In the semiconductor device of the ninth aspect, the second contact hole is provided so as to penetrate the insulation layer, extending from a surface of the wiring layer to a surface of the engagement portion of the gate electrode which is opposite to the surface in engagement with the first contact hole, and therefore the size of the transistor region is reduced as compared with a case where electrical connection between the wiring layer and gate electrode in a portion other than the engagement portion, resulting in size-reduction of the whole device.

In the gate-array semiconductor device of the tenth aspect, the body is connected to the gate electrode without increase in area of the transistor region, allowing a faster operation. Moreover, no isolation layer is provided between a plurality of MOS transistors of the first conductivity type and the second conductivity type, and therefore if the MOS transistors of the first conductivity type are connected in series, and if the MOS transistors of the second conductivity type are connected in series, a source region or a drain region can be shared as main electrode region, resulting in further size-reduction of the whole device.

In the gate-array semiconductor device using the semiconductor device of the eleventh aspect, though the first isolation layer for electrical isolation between the adjacent first array and second array and the second isolation layer for isolation between the MOS transistor of the first conductivity type and the MOS transistor of the second conductivity type are included, the body is connected to the gate electrode without increase in area of the transistor region, allowing a faster operation.

In the data processing means and the data transmitting means using the semiconductor device of the twelfth aspect, the first voltage lower than the built-in voltage of the parasitic diode is used as the operating supply voltage, and therefore, it is possible to prevent a situation where turning-on of the parasitic diode accompanies turning-on of the parasitic bipolar transistor and avoid speeding-down of circuit operation. Moreover, since the data transmitting means using the first voltage lower than the built-in voltage of the parasitic diode as the operating supply voltage is electrically interposed between the data processing means and the input/output means, the semiconductor device of the twelfth aspect can coexist with a semiconductor device using the second voltage as the operating supply voltage. The input/output means, which uses the second voltage equal to or higher than the built-in voltage of the parasitic diode as the operating supply voltage, is hardly affected by external noise and can protect the data processing means.

In the semiconductor device of the thirteenth aspect for performing read/write operation of data through discharge/charge of capacitative elements, a faster read/write operation is achieved, and moreover, since the body is fixed to a constant potential, it is possible to prevent malfunction due to entrance of α ray of the cosmic ray into the semiconductor layer, i.e., soft error. Further, no need for enlargement in area of the transistor region rises for prevention of the malfunction, and accordingly size-reduction of the semiconductor device is achieved.

An object of the present invention is to provide a semiconductor device for fast operation with the gate terminal and the body terminal connected, which removes restriction on location for connection between the gate and body terminals to achieve size-reduction and resolves disadvantages due to limitation of the supply voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Introduction

As a construction to connect the body terminal to the gate terminal, the inventors think of such a construction as discussed below from the general MOS transistor in which the body terminal is connected to the source terminal.

Figure 1:
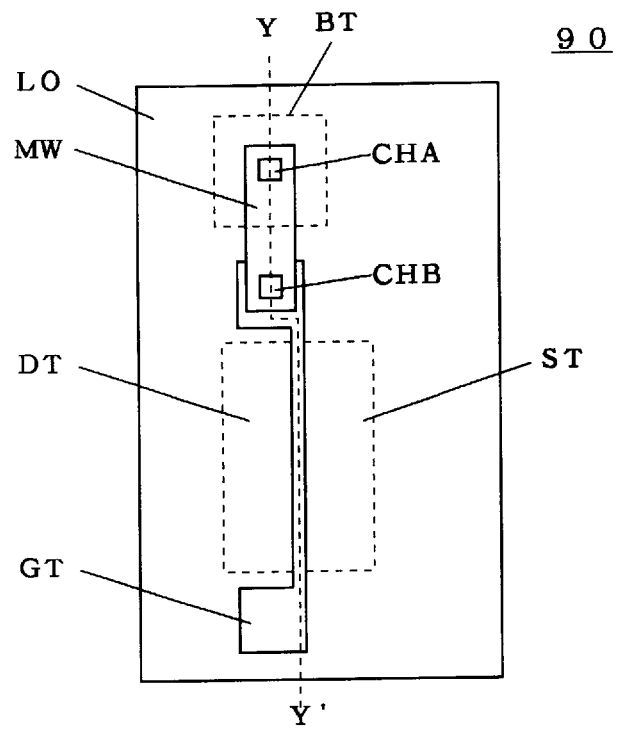
FIG. 1 is a plan view illustrating an exemplary construction to connect the body terminal to the gate terminal.

FIG. 1 is a plan view illustrating a layout of a PMOS transistor 90 in which the body terminal is connected to the gate terminal. A gate electrode and its peripheral elements are shown in FIG. 1. A metal wire MW is placed over from one of ends of an elongated gate electrode GT through the body terminal region BT. Since an oxide film LO is so provided as to cover the gate electrode GT, in fact, the gate electrode GT can not be seen but is indicated by a solid line for clarity.

The metal wire MW and the body terminal BT are connected through a contact hole CHA, and the metal wire MW and the gate electrode GT are connected through a contact hole CHB.

On both sides of the center portion of the gate electrode GT, a drain region DT and a source region ST are provided along its length. Further, a channel region is located immediately below the gate electrode GT.

Figure 2:
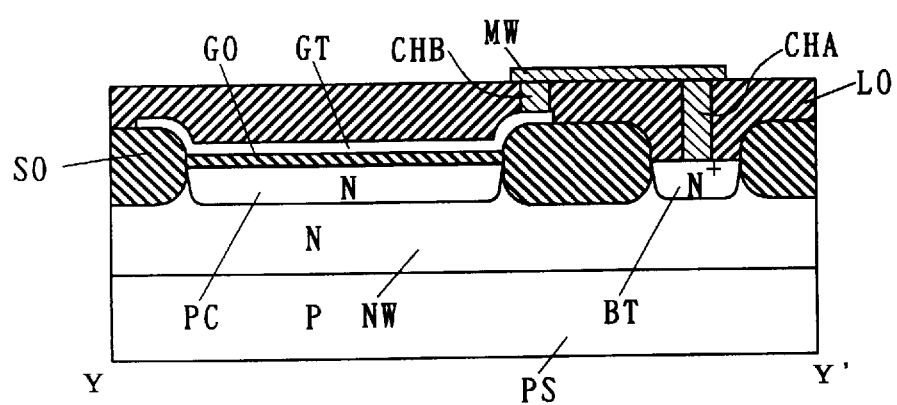
FIGS. 2 and 3 are cross sections illustrating the exemplary construction to connect the body terminal to the gate terminal.

FIG. 2 is a cross section of FIG. 1 along the line Y–Y' showing the PMOS transistor 90 using a bulk silicon substrate.

In FIG. 2, an N-type well layer NW is provided on a P-type bulk silicon substrate PS, and a channel region PC is formed in the N-type well layer NW. The channel region PC has a polarity (N-type) reverse to that of the source region ST and the drain region DT, and the source region ST and the drain region DT are opposed to each other with the channel region PC interposed therebetween.

The gate electrode GT is provided above the channel region PC with a gate oxide film GO interposed therebetween. Further, the oxide film LO is so provided as to cover the gate electrode GT and other elements.

The channel region PC is isolated from other semiconductor layers with an oxide film SO provided longitudinally outside the channel region PC, and the gate electrode GT extends so that both its longitudinal end portions may be disposed on the oxide film SO. One of the longitudinal end portions of the gate electrode GT is connected to the metal wire MW provided on the oxide film LO through the contact hole CHB penetrating the oxide film LO.

The metal wire MW is connected to the N+-type body terminal region BT (having high N-type impurity concentration) provided in the N-type well layer NW through the contact hole CHA penetrating the oxide film LO. Accordingly, the gate electrode GT is connected to the N-type well layer NW (body) through the body terminal region BT and the body terminal region BT is connected to the N-type channel region PC through the N-type well layer NW.

Furthermore, the reason why N+-type semiconductor is used for the body terminal region BT is that the semiconductor of high impurity concentration can reduce a contact resistance caused by connection between the metal wire MW and the N-type well layer NW.

Figure 3:
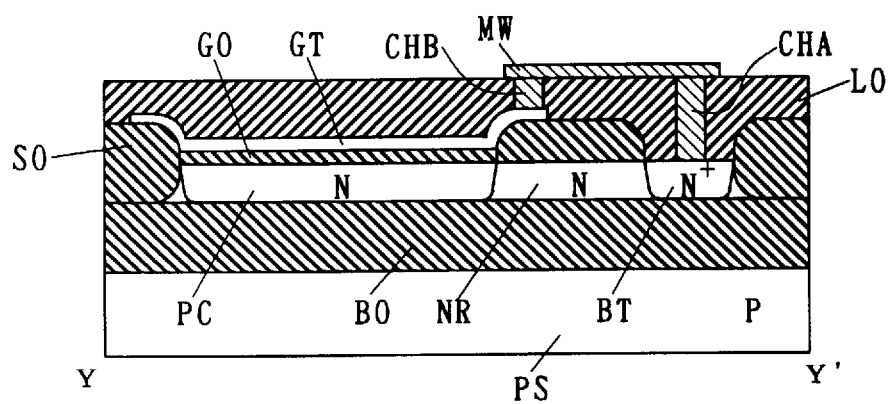

FIG. 3 is a cross section of FIG. 1 along the line Y–Y' showing the PMOS transistor 90 using a SOI (Silicon On Insulator) silicon substrate.

In FIG. 3, a buried oxide film BO is provided in the P-type bulk silicon substrate PS. The SOI silicon substrate generally has a construction in which an oxide film is provided on a bulk silicon substrate, and in this case, the buried oxide film BO is buried in the bulk silicon substrate PS. In FIG. 3, elements identical to those of FIG. 2 in a case of using the bulk silicon substrate are represented by the same reference characters as those of FIG. 2, and redundant discussion will be omitted.

When the MOS transistor is formed using the SOI silicon substrate, the capacity of the source and drain regions is reduced since the transistor is formed in the semiconductor layer on the buried oxide film, and therefore a transistor for fast operation is achieved.

In FIG. 3, like in FIG. 2, one of the longitudinal end portions of the gate electrode GT is connected to the metal wire MW provided on the oxide film LO through the contact hole CHB penetrating the oxide film LO, and the metal wire MW is connected to the N+-type body terminal region BT provided in the N-type well layer NW through the contact hole CHA penetrating the oxide film LO.

The body terminal region BT is connected to the channel region PC through the N-type semiconductor region NR provided between the channel region PC and the body terminal region BT.

In a process of forming the N-type semiconductor region NR, the oxide film SO provided between the channel region PC and the body terminal region BT must not reach the buried oxide film BO.

Thus, the PMOS transistor 90 of FIG. 1 is can be provided on both the bulk silicon substrate and the SOI silicon substrate.

Figure 4:
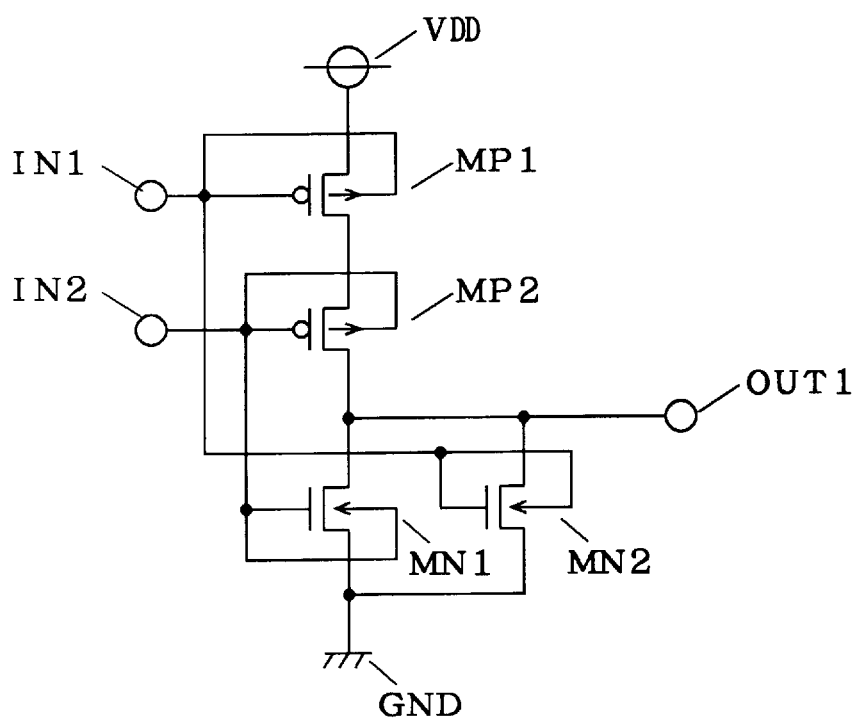
FIG. 4 illustrates a two-input NOR gate having the construction of the present invention.

FIG. 4 illustrates a two-input NOR gate, as an exemplary circuit configuration using the NMOS transistors and PMOS transistors in which the body terminal is connected to the gate terminal.

In FIG. 4, PMOS transistors MP1 and MP2 and an NMOS transistor MN1 are connected in series between a supply potential $V_{DD}$ (the first potential) and a ground potential GND (the third potential), and an NMOS transistor MN2 is connected in parallel with the NMOS transistor MN1 between the drain and source electrodes of NMOS transistor MN1.

The gate electrodes of PMOS transistor MP1 and NMOS transistor MN2 are connected to a first input terminal IN1, and the gate electrodes of PMOS transistor MP1 and NMOS transistor MN1 are connected to a second input terminal IN2. The drain electrodes of NMOS transistors MN1 and MN2 are connected to an output terminal OUT1.

Figure 5:
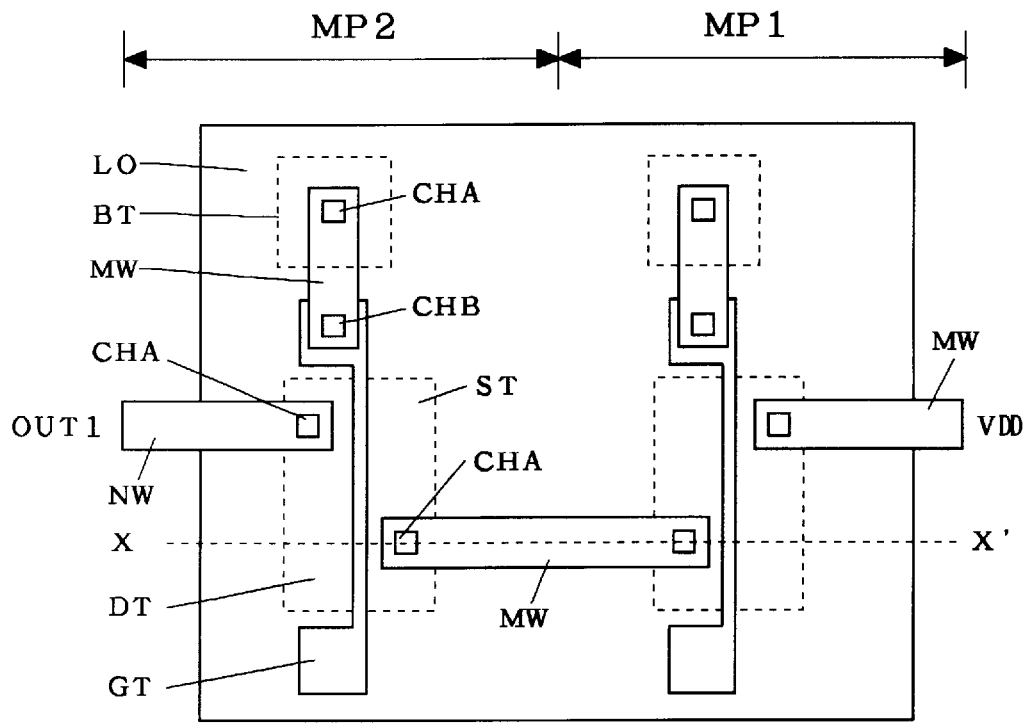
FIG. 5 is a plan view illustrating a partial construction of the two-input NOR gate.

A layout of the PMOS transistors MP1 and MP2 in the two-input NOR gate of FIG. 4 is shown in FIG. 5.

In FIG. 5, two elongated gate electrodes GT are arranged in parallel. The gate electrode of PMOS transistor MP1 is disposed on the right side of FIG. 5 and that of PMOS transistor MP2 is disposed on the left side.

In each of the two PMOS transistors, the metal wire MW is placed over from one of the end portions of the gate electrode GT to the body terminal region BT. The oxide film LO is so provided as to cover the two gate electrodes GT. In fact, the gate electrodes GT are not seen, but are indicated by solid lines for clarity.

The metal wire MW is connected to the body terminal BT through the contact hole CHA, and connected to the gate electrode GT through the contact hole CHB.

The drain region DT and the source region ST are provided on both sides of the center portion of the gate electrode GT along its length. The metal wire MW is placed over from the source region ST of PMOS transistor MP2 to the drain region DT of PMOS transistor MP1. The metal wire MW is connected to the drain region DT and the source region ST through the contact holes CHA.

Another metal wire MW is connected to the drain region DT of PMOS transistor MP2 through the contact hole CHA and on the other side, connected to the output terminal OUT1. Further, still another metal wire MW is connected to the source region ST of PMOS transistor MP1 through the contact hole CHA and on the other side, connected to the supply potential $V_{DD}$.

Figure 6:
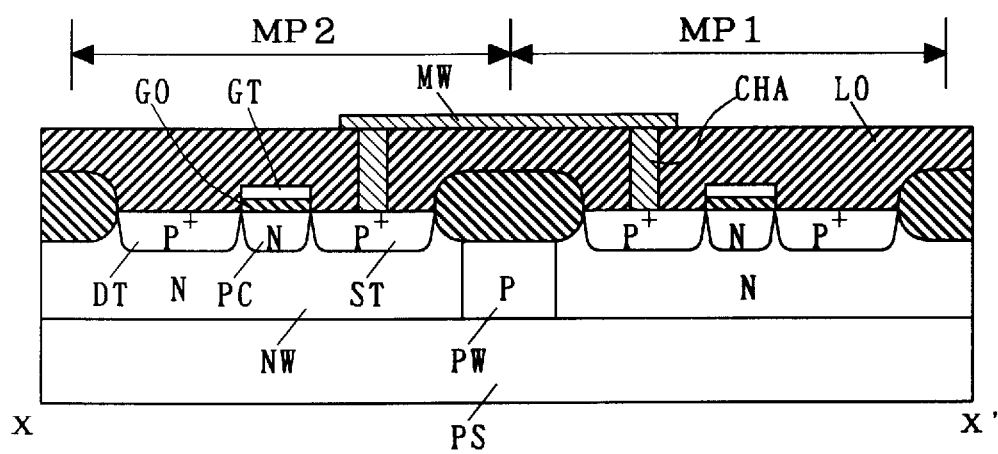
FIGS. 6 and 7 are partial cross sections illustrating the construction of the two-input NOR gate.

FIG. 6 is a cross section of FIG. 5 along the line X–X' showing the PMOS transistors MP1 and MP2 using the bulk silicon substrate.

In FIG. 6, two N-type well layers NW are provided on the P-type bulk silicon substrate PS correspondingly to the two PMOS transistors MP1 and MP2. Furthermore, a P-type well region PW is formed between the two N-type well layers NW to isolate the respective body regions from each other.

In each of the two N-type well layers NW, the N-type channel region PC is formed and the P+-type drain region DT and the P+-type source region ST are opposed to each other with the channel region PC interposed therebetween. The gate electrode GT is provided above the channel region PC with the gate oxide film GO interposed therebetween. The oxide film LO is so provided as to cover the gate electrode GT and other elements.

The PMOS transistors MP1 and MP2 are electrically isolated from each other with the oxide film SO and the P-type well region PW.

The drain region DT of PMOS transistor MP1 and the source region ST of PMOS transistor MP2 are connected to the metal wire MW provided on the oxide film LO through the contact holes CHA penetrating the oxide film LO.

Figure 7:
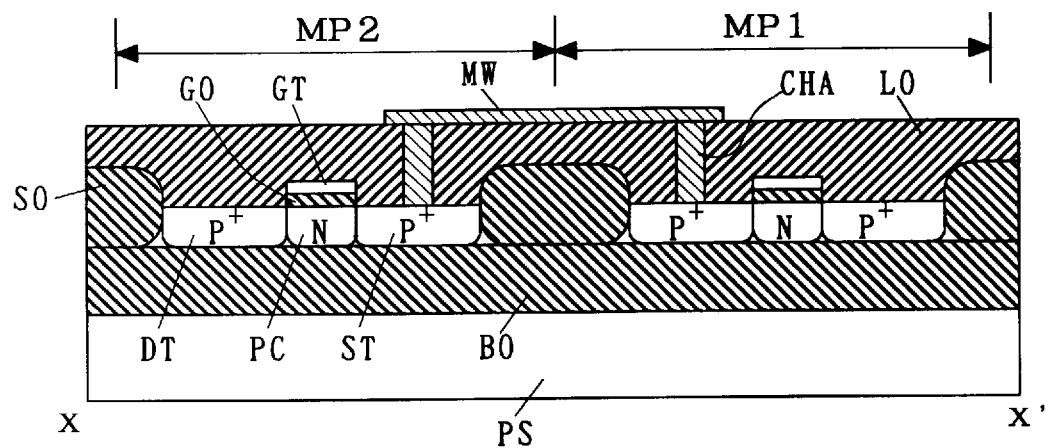

FIG. 7 is a cross section of FIG. 5 along the line X–X' showing the PMOS transistors MP1 and MP2 using the SOI silicon substrate.

In FIG. 7, the buried oxide film BO is buried in the P-type bulk silicon substrate PS. In FIG. 7, elements identical to those of FIG. 6 in a case of using the bulk silicon substrate are represented by the same reference characters as those of FIG. 6, and redundant discussion will be omitted.

In FIG. 7, like in FIG. 6, the drain region DT of PMOS transistor MP1 and the source region ST of PMOS transistor MP2 are connected to the metal wire MW provided on the oxide film LO through the contact holes CHA penetrating the oxide film LO.

The oxide film SO is provided between the PMOS transistors MP1 and MP2 so as to reach the buried oxide film BO, and the PMOS transistors MP1 and MP2 are electrically isolated from each other with the oxide film SO and the buried oxide film BO.

Thus, in the PMOS transistor 90 having an exemplary construction to connect the body terminal to the gate terminal, outside the source and drain regions, the metal wire is connected to another semiconductor layer ($N^+$-type body terminal region BT in FIG. 2) provided separately from the source and drain regions through the contact hole and on the other side, connected to the gate electrode through the contact hole.

Therefore, a need for additionally providing another semiconductor layer outside the source and drain regions rises, disadvantageously causing enlargement in size of the transistor region.

When two MOS transistors connected in series are isolated from each other with the oxide film and the metal wire connects the source region and the drain region of the two MOS transistors, restriction to achieve close-arrangement of the two MOS transistors is considerable, and therefore size-reduction of the whole device is impossible.

Figure 55:
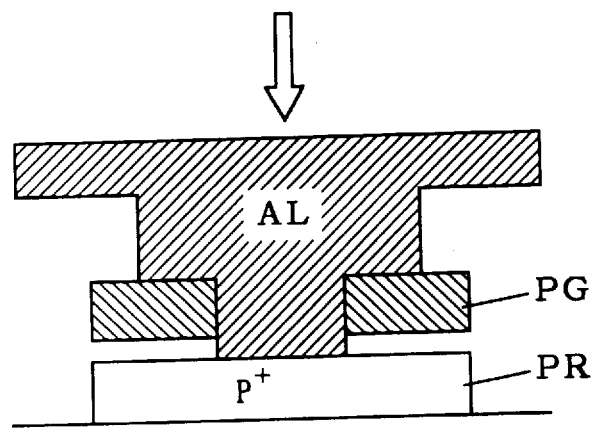
FIG. 55 is a cross section of a background-art construction to connect the body terminal to the gate terminal.
Figure 56:
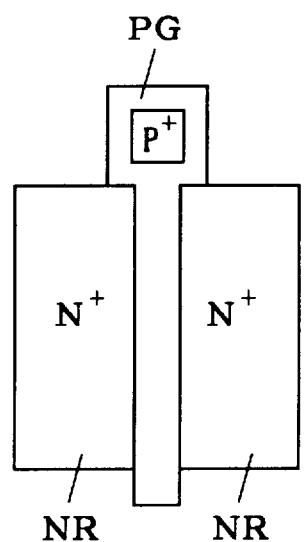
FIG. 56 is a plan view of the background-art construction to connect the body terminal to the gate terminal.

Then, constructions to resolve the problems discussed above and those in the background art discussed earlier referring to FIGS. 55 and 56 will be presented as the first to tenth preferred embodiments.

B. The First Preferred Embodiment

<B-1. Device Construction>

Figure 8:
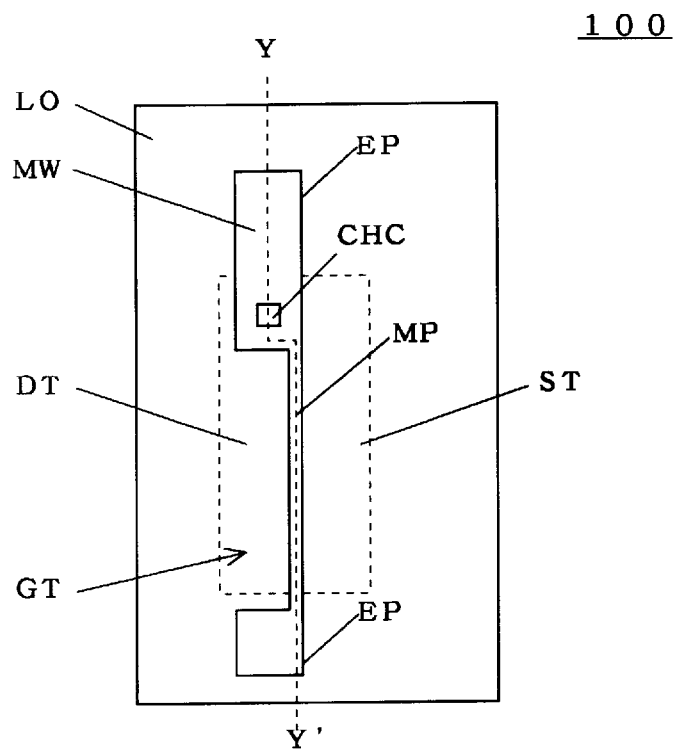
FIG. 8 is a plan view of a construction in accordance with a first preferred embodiment of the present invention.

FIG. 8 illustrates a layout of a PMOS transistor 100 in which the body terminal is connected to the gate terminal in accordance with the first preferred embodiment of the present invention. In FIG. 8, the gate electrode GT is of elongated shape, having a main portion MP above the channel region and end portions EP on both ends of the main portion MP.

In the gate electrode GT of FIG. 8, one of the ends of main portion MP has the same width as the end portion EP, and a contact hole CHC is provided thereon. In fact, the gate electrode GT is not seen since covered with the oxide film LO, but is indicated by a solid line for clarity. The contact hole CHC is also not seen since covered with the gate electrode GT, but is indicated by a solid line for clarity.

The drain region DT and the source region ST are provided on both sides of the main portion MP of the gate electrode GT along its length. Immediately below the gate electrode GT, the channel region is formed.

Figure 9:
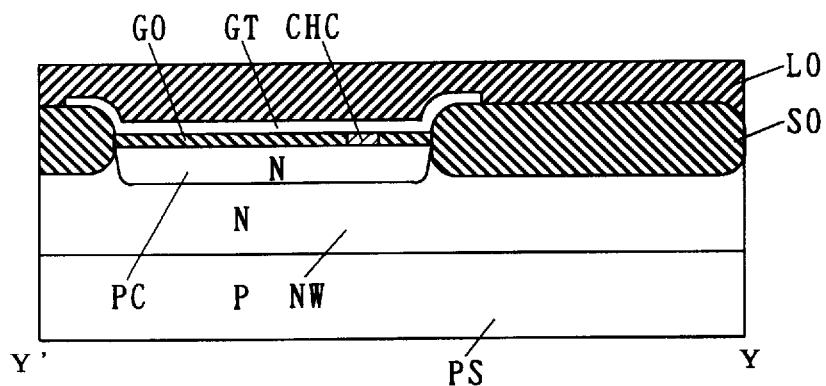
FIGS. 9 and 10 are cross sections of the construction in accordance with the first preferred embodiment of the present invention.

FIG. 9 is a cross section of FIG. 8 along the line Y-Y' showing the PMOS transistor 100 using the bulk silicon substrate.

In FIG. 9, the N-type well layer NW is provided on the P-type bulk silicon substrate PS, and the channel region PC is formed in the N-type well layer NW. The channel region PC has a polarity (N-type) reverse to that of the source region ST and the drain region DT, and the source region ST and the drain region DT are opposed to each other with the channel region PC interposed therebetween as shown in FIG. 8.

The gate electrode GT is provided above the channel region PC with the gate oxide film GO interposed therebetween. The oxide film LO is so provided as to cover the gate electrode GT and other elements.

The channel region PC is isolated from other semiconductor layers with the oxide films SO provided on both the longitudinal ends thereof, and the gate electrode GT extends so that the end portions EP may be disposed on the oxide films SO. The contact hole CHC is provided in the gate oxide film GO located below the main portion MP close to the end portion EP of the gate electrode GT. Accordingly, the gate electrode GT is electrically connected to the channel region PC (i.e., body region) though the contact hole CHC.

The contact hole CHC is filled with a conductor layer, and therefore, the phrase "electrically connected through the contact hole" naturally refers to "electrically connected through the conductor layer filling the contact hole".

Figure 10:
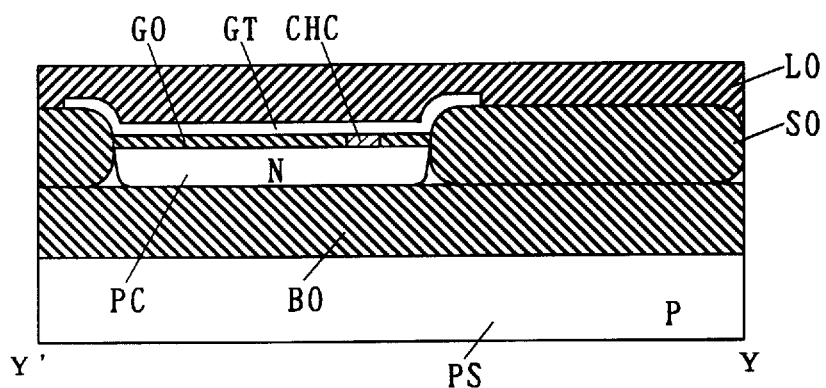

FIG. 10 is a cross section of FIG. 8 along the line Y-Y' showing the PMOS transistor 100 using the SOI silicon substrate.

In FIG. 10, the buried oxide film BO is buried in the P-type bulk silicon substrate PS. In FIG. 10, elements identical to those of FIG. 9 in a case of using the bulk silicon substrate are represented by the same reference characters as those of FIG. 9, and redundant discussion will be omitted.

In FIG. 10, like in FIG. 9, the contact hole CHC is provided in the gate oxide film GO located below the main portion MP close to the end portion EP of the gate electrode GT. Accordingly, the gate electrode GT is electrically connected to the channel region PC (i.e., body region) through the contact hole CHC.

<B-2. Characteristic Function and Effect>

Thus, in the PMOS transistor 100, the gate electrode GT and the channel region PC (i.e., body region) are electrically connected through the contact hole CHC penetrating the gate oxide film GO, and therefore, no additional semiconductor layer to be the body region BT needs to be provided outside the source region and the drain region, unlike in the PMOS transistor 90 shown in FIGS. 1 to 3, thus achieving size-reduction of transistor region.

Moreover, since the contact hole CHC is so provided as to penetrate only the gate oxide film GO, it has a shallow depth and is easily manufactured.

C. The Second Preferred Embodiment

<C-1. Device Construction>

Figure 11:
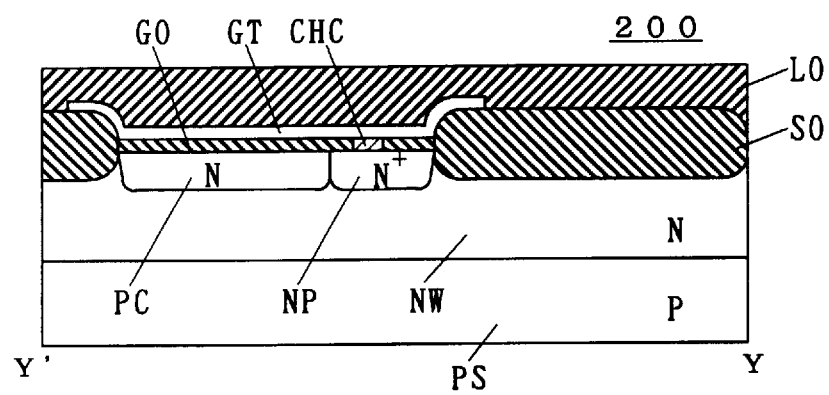
FIGS. 11 and 12 are cross sections of a construction in accordance with a second preferred embodiment of the present invention.
Figure 12:
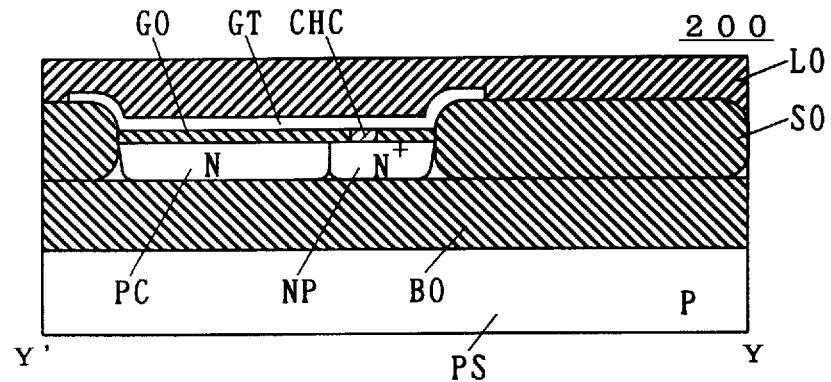

FIGS. 11 and 12 are cross sections of a PMOS transistor 200 in which the body terminal is connected to the gate terminal in accordance with the second preferred embodiment of the present invention. A plan view showing a layout of the PMOS transistor 200 is the same as that of the PMOS transistor 100 shown in FIG. 8, so omitted. Furthermore, FIGS. 11 and 12 are cross sections along the line Y-Y' of FIG. 8.

FIG. 11 illustrates a sectional construction of the PMOS transistor 200 using the bulk silicon substrate. The N-type well layer NW is provided on the P-type bulk silicon substrate PS and the N-type channel region PC and an $N^+$-type semiconductor region NP are provided adjacently to each other in the N-type well layer NW.

The gate electrode GT is provided above the channel region PC and the $N^+$-type semiconductor region NP with the gate oxide film GO interposed therebetween. The oxide film LO is so provided as to cover the gate electrode GT and other elements.

The channel region PC and the $N^+$-type semiconductor region NP are isolated from other semiconductor layers with the oxide film SO provided longitudinally outside them, and the gate electrode GT extends so that its end portions EP may be disposed on the oxide films SO. The contact hole CHC is provided in the gate oxide film GO located above the N+-type semiconductor region NP. Accordingly, the gate electrode GT is electrically connected to the N+-type semiconductor region NP (i.e., body region) through the contact hole CHC.

FIG. 12 illustrates a sectional construction of the PMOS transistor 200 using the SOI silicon substrate.

In FIG. 12, the buried oxide film BO is buried in the P-type bulk silicon substrate PS. In FIG. 12, elements identical to those of FIG. 11 in a case of using the bulk silicon substrate are represented by the same reference characters as those of FIG. 11, and redundant discussion will be omitted.

In FIG. 12, like in FIG. 11, the contact hole CHC is provided in the gate oxide film GO located above the N+-type semiconductor region NP. Accordingly, the gate electrode GT is electrically connected to the N+-type semiconductor region NP (i.e., body region) through the contact hole CHC.

<C-2. Characteristic Function and Effect>

Thus, in the PMOS transistor 200, the gate electrode GT and the N+-type semiconductor region (i.e., body region) are electrically connected through the contact hole CHC penetrating the gate oxide film GO, and therefore, no additional semiconductor layer to be the body region BT needs to be provided outside the source region and the drain region, unlike the PMOS transistor 90 shown in FIGS. 1 to 3, thus achieving size-reduction of transistor region.

Moreover, since the contact hole CHC is connected to the N+-type semiconductor region NP, the contact resistance caused by the connection between the N+-type semiconductor region NP and the conductor filling the contact hole CHC is reduced, thus achieving a faster switching operation of the transistor.

D. The Third Preferred Embodiment

<D-1. Device Construction>

Figure 13:
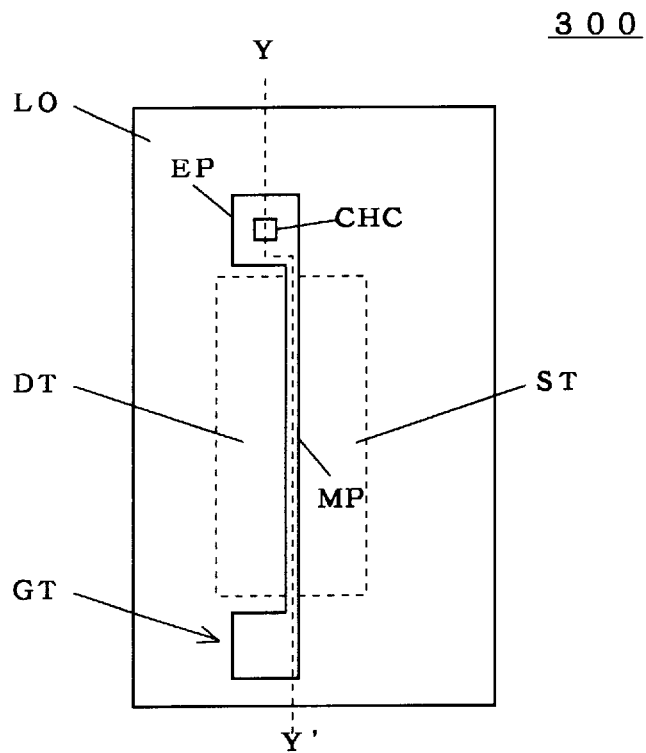
FIG. 13 is a plan view of a construction in accordance with a third preferred embodiment of the present invention.

FIG. 13 illustrates a layout of a PMOS transistor 300 in which the body terminal is connected to the gate terminal in accordance with the third preferred embodiment of the present invention. In FIG. 13, the gate electrode GT is of elongated shape, having a main portion MP above the channel region and end portions EP which are wide to be provided with a contact hole and located on both ends of the main portion MP. The contact hole is provided on one of the end portions EP.

The drain region DT and the source region ST are provided on both sides of the main portion MP of the gate electrode GT along its length. Immediately below the gate electrode GT, the channel region PC is formed.

In fact, the gate electrode GT is not seen since covered with the oxide film LO, but is indicated by a solid line for clarity. The contact hole CHC is also not seen since covered with the gate electrode GT, but is indicated by a solid line for clarity.

Figure 14:
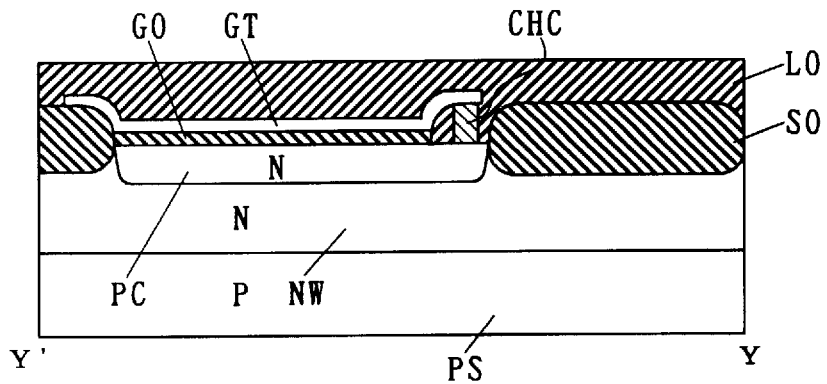
FIGS. 14 and 15 are cross sections of the construction in accordance with the third preferred embodiment of the present invention.

FIG. 14 is a cross section of FIG. 13 along the line Y–Y' showing the PMOS transistor 300 using the bulk silicon substrate.

In FIG. 14, the N-type well layer NW is provided on the P-type bulk silicon substrate PS, and the channel region PC is formed in the N-type well layer NW. The channel region PC has a polarity (N-type) reverse to that of the source region ST and the drain region DT, and the source region ST and the drain region DT are opposed to each other with the channel region PC interposed therebetween as shown in FIG. 13.

The contact hole CHC, as well as the gate electrode GT, is provided above the channel region PC with the gate oxide film GO interposed therebetween. The contact hole CHC penetrates the oxide film LO between one of the end portions EP of the gate electrode GT and the channel region PC.

The channel region PC is isolated from other semiconductor layers with the oxide films SO provided longitudinally outside the channel region PC, and the gate electrode GT extends so that the other end portion EP may be disposed on the oxide film SO. One end portion EP of the gate electrode GT is connected to the channel region PC through the contact hole CHC, and accordingly the gate electrode is electrically connected to the channel region PC (i.e., the body region).

Figure 15:
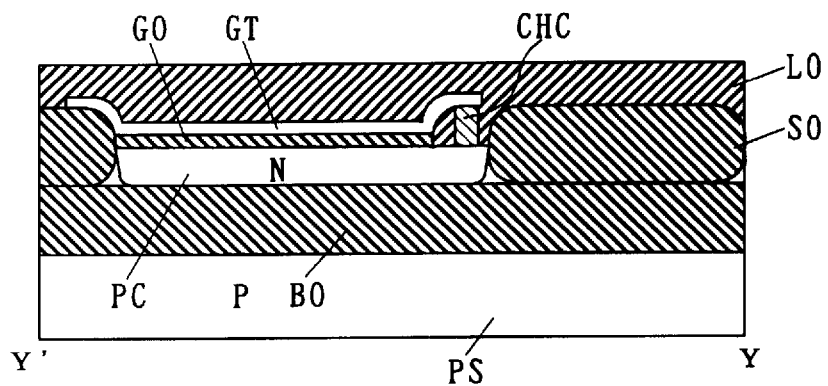

FIG. 15 is a cross section of FIG. 13 along the line Y–Y' showing the PMOS transistor 300 using the SOI silicon substrate.

In FIG. 15, the buried oxide film BO is buried in the P-type bulk silicon substrate PS. In FIG. 15, elements identical to those of FIG. 14 in a case of using the bulk silicon substrate are represented by the same reference characters as those of FIG. 14, and redundant discussion will be omitted.

In FIG. 15, like in FIG. 14, one end portion EP of the gate electrode GT is connected to the channel region PC through the contact hole CHC, and accordingly the gate electrode GT is electrically connected to the channel region PC (i.e., the body region).

<D-2. Characteristic Function and Effect>

Thus, in the PMOS transistor 300, the gate electrode GT and the channel region PC (i.e., body region) are electrically connected through the contact hole CHC penetrating the oxide film LO between the one end portion EP of the gate electrode GT and the channel region PC, and therefore, no additional semiconductor layer to be the body region BT needs to be provided outside the source region and the drain region, unlike the PMOS transistor 90 shown in FIGS. 1 to 3, thus achieving size-reduction of transistor region.

Moreover, since the contact hole CHC is so provided as to connect one end portion EP of the gate electrode GT and the channel region PC, the area of main portion MP of the gate electrode GT is reduced as compared with the construction in which the contact hole CHC is provided below the main portion MP of the gate electrode GT. The area-reduction of the main portion MP of the gate electrode GT leads to area-reduction of the oxide film GO which defines capacitance of the gate, allowing a cut in time for charging and discharging the capacitance of the gate.

E. The Fourth Preferred Embodiment

<E-1. Device Construction>

Figure 16:
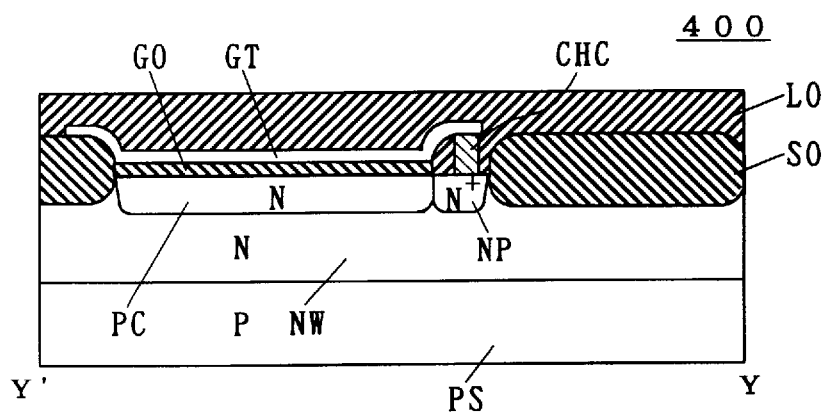
FIGS. 16 and 17 are cross sections of a construction in accordance with a fourth preferred embodiment of the present invention.
Figure 17:
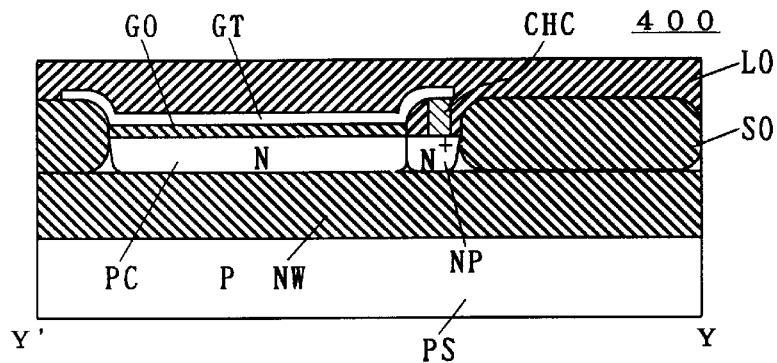

FIGS. 16 and 17 are cross sections of a PMOS transistor 400 in which the body terminal is connected to the gate terminal in accordance with the fourth preferred embodiment of the present invention. A plan view showing a layout of the PMOS transistor 400 is the same as that of the PMOS transistor 300 shown in FIG. 13, so omitted. Furthermore, FIGS. 16 and 17 are cross sections along the line Y–Y' of FIG. 13.

FIG. 16 illustrates a sectional construction of the PMOS transistor 400 using the bulk silicon substrate. The N-type well layer NW is provided on the P-type bulk silicon substrate PS and the N-type channel region PC and the N+-type semiconductor region NP are provided adjacently to each other in the N-type well layer NW.

The gate electrode GT is provided above the channel region PC with the gate oxide film GO interposed therebetween. The contact hole CHC is provided above the N+-type semiconductor region NP, penetrating the oxide film LO between one of the end portions EP of the gate electrode GT and the N+-type semiconductor region NP.

The channel region PC and the N+-type semiconductor region NP are isolated from other semiconductor layers with the oxide film SO provided longitudinally outside them, and the gate electrode GT extends so that the other end portion EP may be disposed on the oxide film SO.

The one end portion EP of the gate electrode GT is connected to the N+-type semiconductor region NP through the contact hole CHC, and accordingly, the gate electrode GT is electrically connected to the N+-type semiconductor region NP (i.e., body region).

FIG. 17 illustrates a sectional construction of the PMOS transistor 400 using the SOI silicon substrate.

In FIG. 17, the buried oxide film BO is buried in the P-type bulk silicon substrate PS. In FIG. 17, elements identical to those of FIG. 16 in a case of using the bulk silicon substrate are represented by the same reference characters as those of FIG. 16, and redundant discussion will be omitted.

In FIG. 17, like in FIG. 16, one end portion EP of the gate electrode GT is connected to the N+-type semiconductor region NP through the contact hole CHC, and accordingly, the gate electrode GT is electrically connected to the N+-type semiconductor region NP (i.e., body region).

<E-2. Characteristic Function and Effect>

Thus, in the PMOS transistor 400, the gate electrode GT and the N+-type semiconductor region NP (i.e., body region) are electrically connected through the contact hole CHC penetrating the gate oxide film LO between one end portion EP of the gate electrode GT and the N+-type semiconductor region NP, and therefore, no additional semiconductor layer to be the body region BT needs to be provided outside the source region and the drain region, unlike the PMOS transistor 90 shown in FIGS. 1 to 3, thus achieving size-reduction of transistor region.

Moreover, since the contact hole CHC is so provided as to connect one end portion EP of the gate electrode GT and the channel region PC, the area of main portion MP of the gate electrode GT is reduced as compared with the construction in which the contact hole CHC is provided below the main portion MP of the gate electrode GT. The area-reduction of the main portion MP of the gate electrode GT leads to area-reduction of the oxide film GO which defines capacitance of the gate, allowing a cut in time for charging and discharging the capacitance of the gate.

Moreover, since the contact hole CHC is connected to the N+-type semiconductor region NP, the contact resistance caused by the connection between the N+-type semiconductor region NP and the conductor filling the contact hole CHC is reduced, thus achieving a faster switching operation of the transistor.

F. The Fifth Preferred Embodiment

<F-1. Device Construction>

Figure 18:
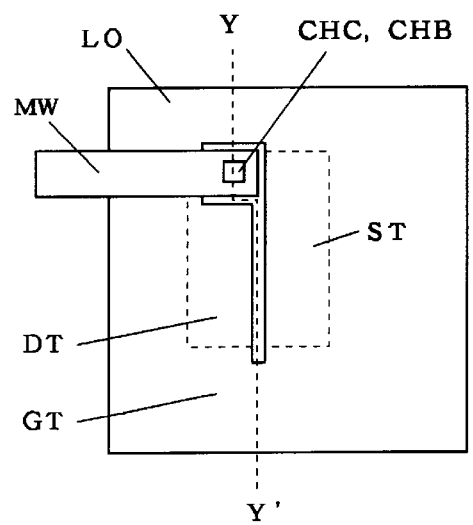
FIG. 18 is a plan view of a construction in accordance with a fifth preferred embodiment of the present invention.

FIG. 18 illustrates a layout of a PMOS transistor 500 in which the body terminal is connected to the gate terminal in accordance with the fifth preferred embodiment of the present invention. In FIG. 18, the elongated gate electrode GT is provided only above the channel region, and specifically, it has only the main portion MP. One of the longitudinal ends of the main portion MP is wide, and the metal wire MW is placed thereover and the contact hole CHB is provided to connect the metal wire MW and the gate electrode GT. Further, the contact hole CHC is provided below the contact hole CHB.

The drain region DT and the source region ST are provided on both sides of the main portion MP of the gate electrode GT. Immediately below the gate electrode GT, the channel region is formed.

In fact, the gate electrode GT is not seen since covered with the oxide film LO, but is indicated by a solid line for clarity. The contact holes CHB and CHC are also not seen since covered with the metal wire MW and the gate electrode GT, respectively, but are indicated by solid lines for clarity.

Figure 19:
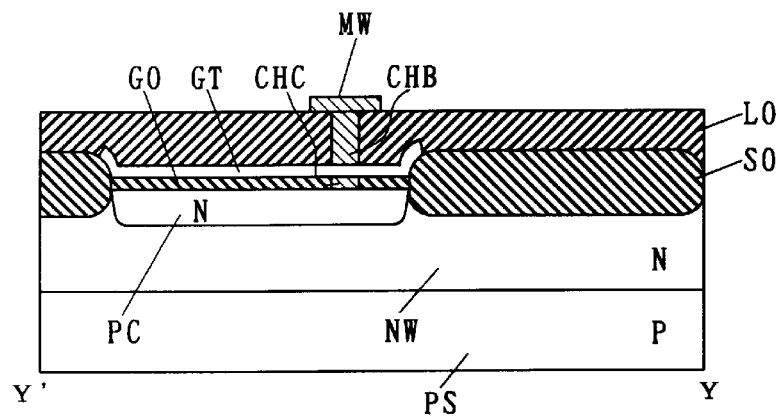
FIG. 19 is a cross section of the construction in accordance with the fifth preferred embodiment of the present invention.

FIG. 19 is a cross section of FIG. 18 along the line Y–Y' showing the PMOS transistor 500 using the bulk silicon substrate.

In FIG. 19, the N-type well layer NW is provided on the P-type bulk silicon substrate PS, and the channel region PC is formed in the N-type well layer NW. The channel region PC has a polarity (N-type) reverse to that of the source region ST and the drain region DT, and the source region ST and the drain region DT are opposed to each other with the channel region PC interposed therebetween as shown in FIG. 19.

The gate electrode GT is provided above the channel region PC with the gate oxide film GO interposed therebetween. The contact hole CHC penetrates the gate oxide film GO located below one end of the gate electrode GT.

This construction is similar to that of the PMOS transistor 100 of FIG. 9 in accordance with the first preferred embodiment, and has the same function and effect. Besides, this construction provides an input path of gate signals towards the gate electrode GT by connecting the metal wire MW and the contact hole CHB penetrating the oxide film LO located above one end of the gate electrode GT.

<F-2. Characteristic Function and Effect>

Thus, in the PMOS transistor 500, one end of the main portion MP of the gate electrode GT is electrically connected to the metal wire MW as well as the channel region PC, and therefore, the transistor region is reduced to achieve size-reduction of the whole device, as compared with a case where the end portion EP of the gate electrode GT is electrically connected to the metal wire MW.

G. The Sixth Preferred Embodiment

<G-1. Device Construction>

In the first to fifth preferred embodiments, the PMOS transistors have been discussed. Now, a gate-array semiconductor device in accordance with the sixth preferred embodiment of the present invention will be discussed.

Figure 20:
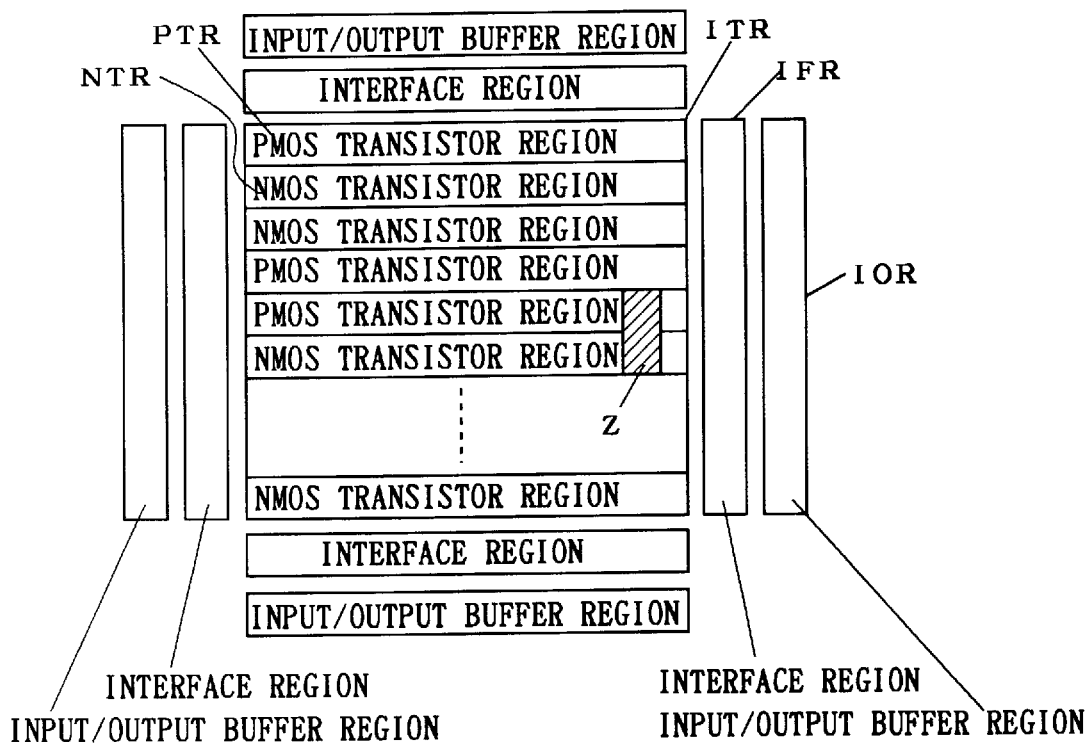
FIG. 20 is a block diagram showing an overall construction of a gate-array semiconductor device in accordance with a sixth preferred embodiment of the present invention.

FIG. 20 is a block diagram of overall construction of a gate-array semiconductor device. In FIG. 20, a plurality of PMOS transistor regions PTR and NMOS transistor regions NTR are regularly arranged in an internal transistor region ITR, interface regions IFR are arranged so as to surround the internal transistor region ITR, and input/output buffer regions IOR are arranged correspondingly to the interface regions IFR.

The internal transistor region ITR may be regarded as data processing means since it processes data which are externally applied, the input/output buffer region IOR may be regarded as input/output means for receiving data which are externally applied and outputting data processed by the internal transistor region ITR (data processing means), and the interface region IFR may be regarded as data transmitting means for transmitting data between the input/output buffer IOR and the internal transistor region ITR.

A gate-array semiconductor device is widely used because of its construction allowing short-term development of semiconductor integrated circuit. In manufacturing the gate-array semiconductor device, a master in which PMOS and NMOS transistors are formed is prepared in advance (the process of preparing the master is called a master process), contact holes are provided and wires are placed according to use's order (this process is called a slice process) and connection is established between transistors, to obtain a desired circuit configuration.

The internal transistor region ITR on completion of the master process is shown in FIG. 20. A region Z of FIG. 20 is shown in FIG. 21 in detail.

Figure 21:
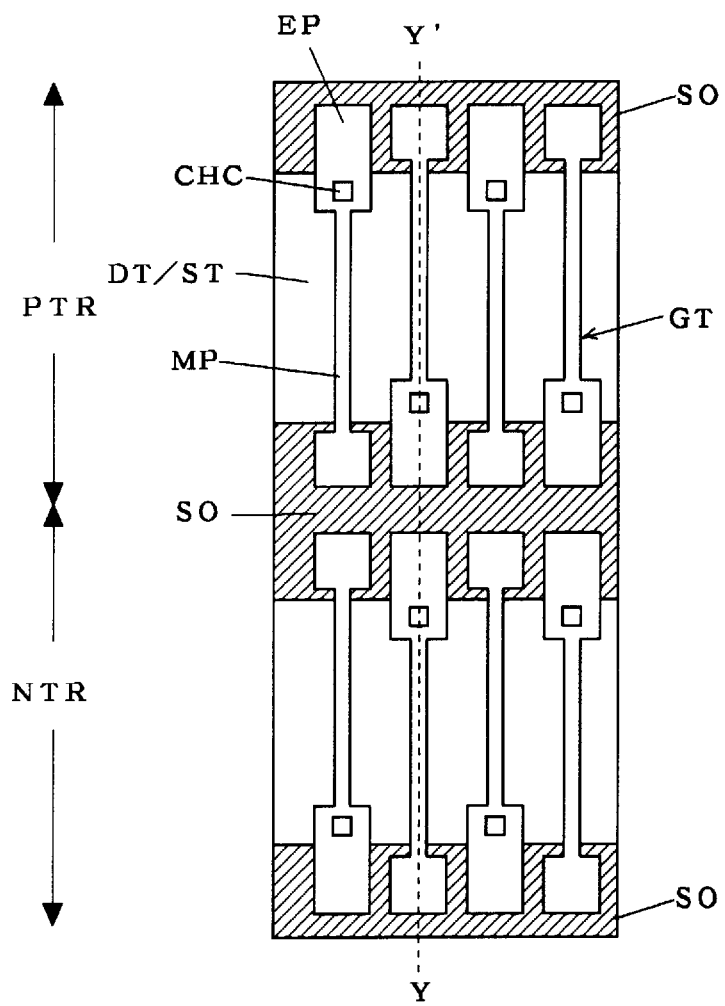
FIGS. 21 and 22 are plan views showing a partial construction of the gate-array semiconductor device in accordance with the sixth preferred embodiment of the present invention.

In FIG. 21, the PMOS transistor regions PTR and NMOS transistor regions NTR are alternately arranged in parallel, and the drain region DT and the source region ST exit between adjacent gate electrodes GT.

The gate electrode GT has the main portion MP located above the channel region and the end portions EP provided on both sides of the main portion MP. As is seen from FIG. 21, one of the ends of the main portion MP has the same width as the end portion EP, and the contact hole CHC is provided thereon. The oxide film SO is provided between the PMOS transistor region PTR and the NMOS transistor region NTR.

Figure 22:
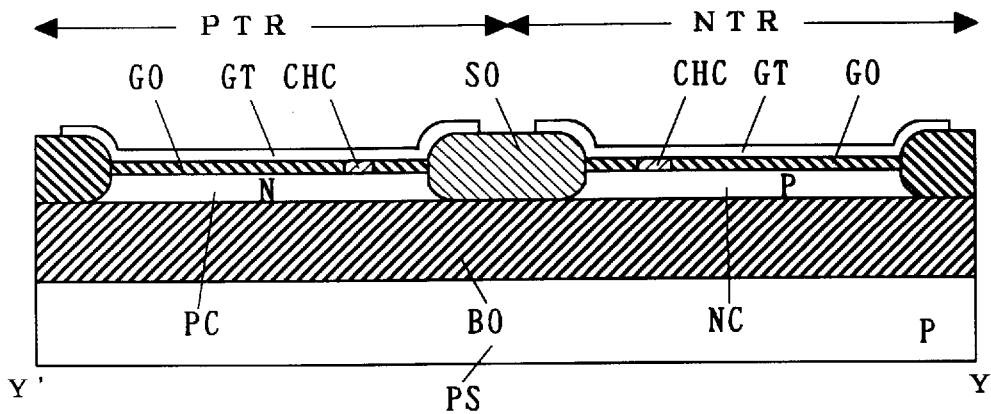

FIG. 22 is a cross section of FIG. 21 along the line Y–Y'. In FIG. 22, the buried oxide film BO is buried in the P-type bulk silicon substrate PS, to form a SOI silicon substrate. The N-type channel region PC and a P-channel region NC are formed on the buried oxide film BO.

The gate electrodes GT are provided above the N-type channel region PC and the P-type channel region NC with the gate oxide films GO interposed therebetween respectively. The contact holes CHC penetrate the gate oxide films GO located below the main portions MP close to the end portions EP of the gate electrodes GT, and the gate electrodes GT are electrically connected to the N-type channel region PC (i.e., body region) and the P-type channel region NC (i.e., body region).

The N-type channel region PC and the P-type channel region NC are isolated from each other with the oxide film SO reaching the buried oxide film BO, and the gate electrode GT extends so that its end portions EP may be disposed on the oxide films SO. Thus, the present invention can be applied to the master for the gate-array semiconductor device.

Figure 23:
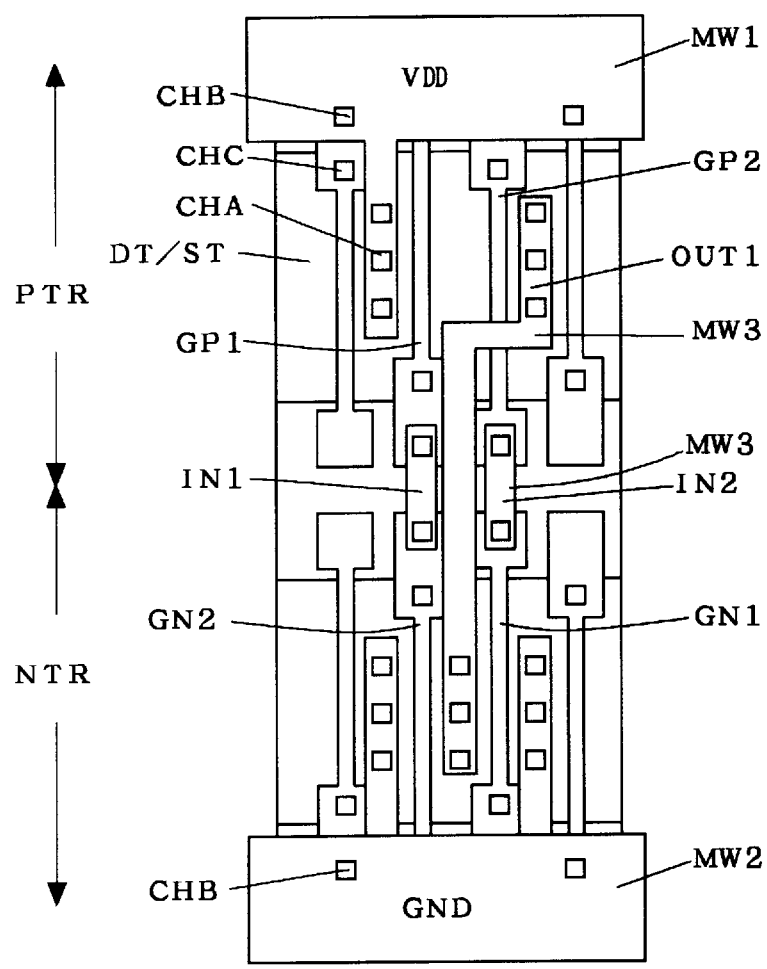
FIG. 23 is a plan view of a layout of the two-input NOR gate formed of the gate-array semiconductor device having the construction of the present invention.

FIG. 23 illustrates a layout of two-input NOR gate disposed on the master of FIG. 21. The discussion on the two-input NOR gate is given referring to FIG. 4, so omitted herein.

In FIG. 23, among four gate electrodes GT provided in parallel in the PMOS transistor region PTR, two gate electrodes in the center portion are designated as GP1 and GP2 and serve as the gate electrodes of PMOS transistors MP1 and MP2, and the other two gate electrodes are connected to a metal wire MW1 which supplies the supply potential $V_{DD}$ (the first potential) therefor through the contact hole CHB, serving as isolating gates for electrical isolation from other PMOS transistors not shown.

The construction to make isolation from adjacent transistors using gate electrodes is termed a gate isolation system.

Further, among four gate electrodes GT provided in parallel in the NMOS transistor region NTR, two gate electrodes in the center portion are designated as GN1 and GN2 and serve as the gate electrodes of NMOS transistors MN1 and MN2, and the other two gate electrodes are connected to a metal wire MW2 which supplies the ground potential GND (the second potential) therefor through the contact hole CHB, serving as isolating gates for electrical isolation from other NMOS transistors not shown.

In FIG. 23, the metal wire MW1 extends over the source region ST of the PMOS transistor MP1 (between the gate electrode GP1 and the isolating gate), and is connected to the source region ST through the contact holes CHA.

The metal wire MW2 extends over the source region ST of the NMOS transistor MN1 (between the gate electrode GN1 and the isolating gate) and the source region ST of the NMOS transistor MN2 (between the gate electrode GN2 and the isolating gate), and is connected to the source regions ST through the contact holes CHA.

The gate electrodes GP1 and GN2 are connected in common to the first input terminal IN1, the gate electrodes GP2 and GN1 are connected in common to the second input terminal IN2, and the drain region DT of the PMOS transistor MP2 (between the gate electrode GP2 and the isolating gate) and the drain regions DT of the NMOS transistors MN1 and MN2 (between the gate electrodes GN1 and GN2) are connected in common to the output terminal OUT1. These connections are established using a metal wire MW3.

<G-2. Characteristic Function and Effect>

Thus, applying the present invention to the master of the gate-array semiconductor device, the gate electrodes GP1, GP2, GN1 and GN2 are electrically connected to the body terminal region through the contact holes CHC, and therefore, no additional semiconductor layer to become the body region BT needs to be provided outside the source region ST and the drain region DT, thus achieving size-reduction of transistor region.

The PMOS transistors MP1 and MP2 which are connected in series are not isolated from each other with the oxide film, and therefore, both transistors have common source region ST and drain region DT, resulting in further size-reduction of the whole device.

H. The Seventh Preferred Embodiment

<H-1. Device Construction>

The present invention may be applied, not only to the gate-array semiconductor integrated circuit using gate isolation system discussed in the sixth preferred embodiment, but also to a gate-array semiconductor integrated circuit using oxide-film isolation system in which adjacent transistors are electrically isolated using an oxide film.

Figure 24:
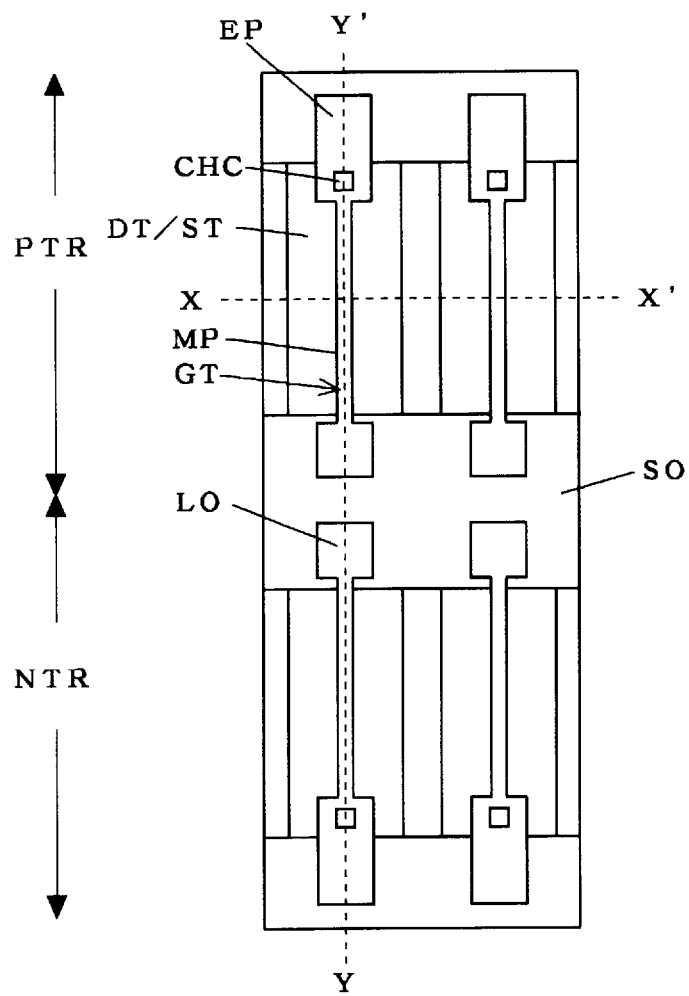
FIG. 24 is a plan view showing a partial construction of a gate-array semiconductor device in accordance with a seventh preferred embodiment of the present invention.

As an example, a master using the oxide-film isolation system is shown in FIG. 24. In FIG. 24, the gate electrodes GT are arranged in parallel in both the PMOS transistor region PTR and the NMOS transistor region NTR, and the oxide film SO is provided between the adjacent gate electrodes GT. Also between the PMOS transistor region PTR and the NMOS transistor region NTR, the oxide film SO is provided.

The gate electrode GT has the main portion MP located above the channel region and the end portions EP provided on both sides of the main portion MP. As is seen from FIG. 24, one of the ends of the main portion MP has the same width as the end portion EP, and the contact hole CHC is provided thereon.

Figure 25:
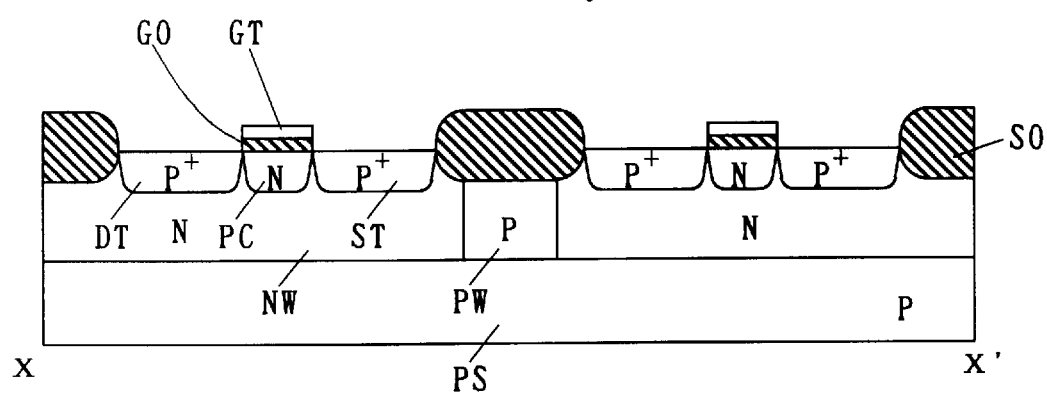
FIGS. 25 to 27 are cross sections showing the partial construction of the gate-array semiconductor device in accordance with the seventh preferred embodiment of the present invention.

FIG. 25 is a cross section of FIG. 24 along the line X–X' showing the master with oxide-film isolated structure using the bulk silicon substrate.

In FIG. 25, two N-type well layers NW are provided on the P-type bulk silicon substrate PS. Further, the P-type well region PW is provided between the two N-type well layers NW to isolate the respective body regions from each other.

In each of the two N-type well layers NW, the N-type channel region PC is provided and the P+-type drain region DT and source region ST are opposed to each other with the N-type channel region PC interposed therebetween. The gate electrode GT is provided above the N-type channel region PC with the gate oxide film GO interposed therebetween. The drain region DT and source region ST are isolated from other semiconductor layers with the oxide film SO outside them.

Figure 26:
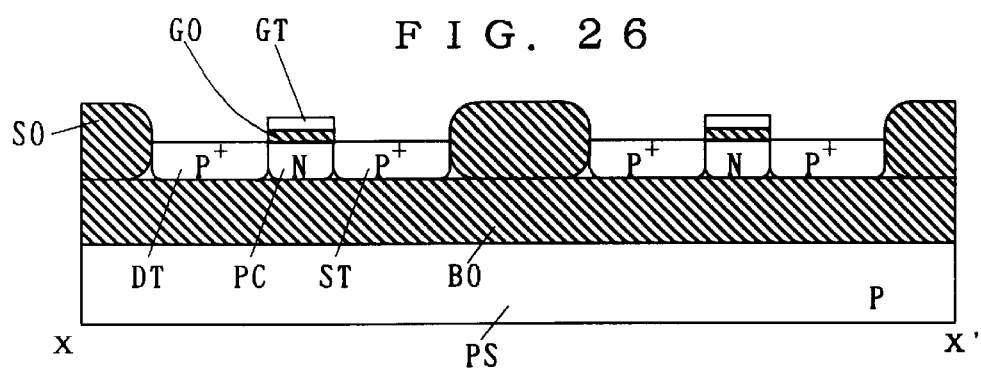

FIG. 26 is a cross section of FIG. 24 along the line X–X' showing the master with oxide-film isolated structure using the SOI silicon substrate.

In FIG. 26, the buried oxide film BO is buried in the P-type bulk silicon substrate PS, and the oxide film SO outside the drain region DT and source region ST reaches the buried oxide film BO, and the transistors are electrically isolated from each other with the oxide film SO and the buried oxide film BO. In FIG. 26, elements identical to those of FIG. 25 in a case of using the bulk silicon substrate are represented by the same reference characters as those of FIG. 14, and redundant discussion will be omitted.

Figure 27:
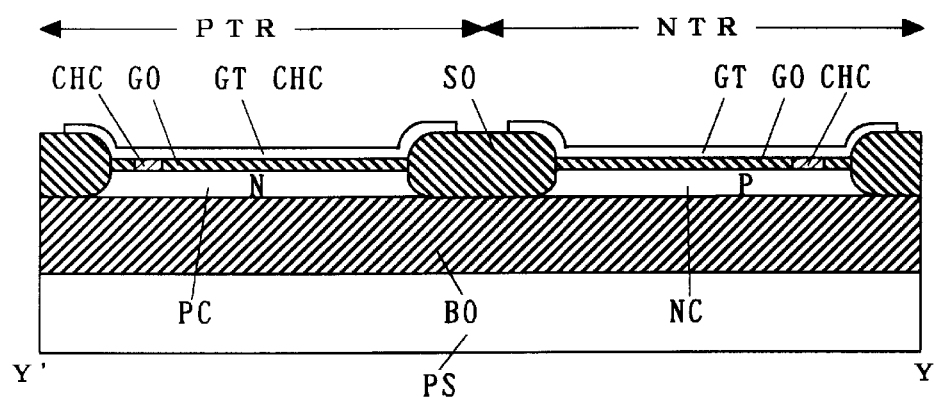

FIG. 27 is a cross section of FIG. 24 along the line Y–Y' showing the master with oxide-film isolated structure using the SOI silicon substrate.

In FIG. 27, the buried oxide film BO is buried in the P-type bulk silicon substrate PS, to form the SOI silicon substrate. The N-type channel region PC and the P-type channel region NC are provided on the buried oxide film BO.

The gate electrode GT is provided above the channel region PC and the channel region NC with the gate oxide film GO interposed therebetween. The contact hole CHC penetrates the gate oxide film GO located below the main portion MP close to the end portion EP of the gate electrode GT, and the gate electrode GT are electrically connected to the channel regions PC and NC (i.e., body regions).

The channel regions PC and NC are isolated from each other with the oxide film SO reaching the buried oxide film BO, and the gate electrode GT extends so that its end portions may be disposed on the oxide films SO.

<H-2. Characteristic Function and Effect>

Thus, applying the present invention to the master of the gate-array semiconductor device with oxide-film isolated structure, the gate electrodes GT are electrically connected to the body terminal regions through the contact holes CHC, and therefore, no additional semiconductor layer to become the body terminal region BT needs to be provided outside the source region ST and the drain region DT in the master, thus achieving size-reduction of transistor region.

I. The Eighth Preferred Embodiment

<I-1. Device Construction>

In the first to seventh preferred embodiments, the practical connections of semiconductor layers to connect the gate terminal and the body terminal have been discussed, taking the PMOS transistors alone or the gate-array semiconductor devices as examples. Now, a circuit configuration to connect the body terminal to the gate terminal in accordance with the eighth preferred embodiment of the present invention will be discussed.

Figure 28:
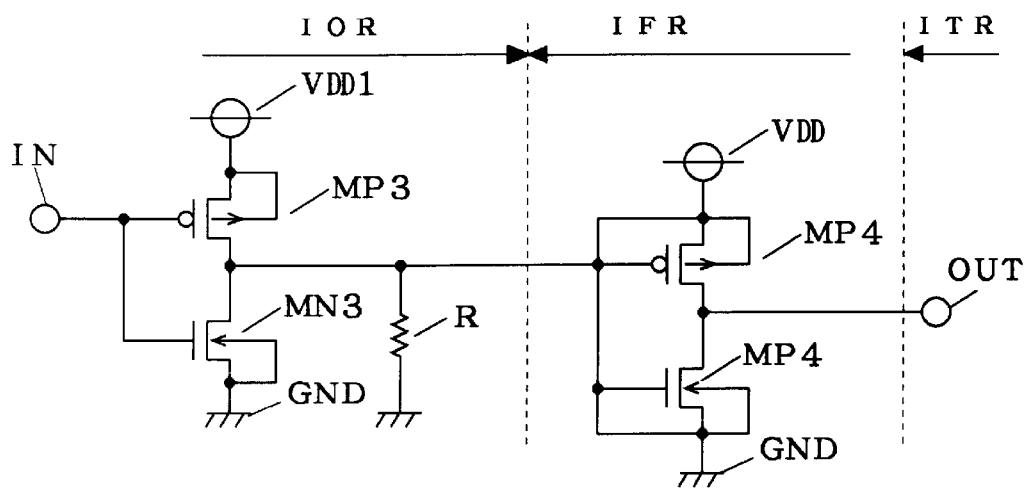
FIG. 28 is a circuit diagram of an eighth preferred embodiment of the present invention.

FIG. 28 illustrates a configuration of the input/output buffer region IOR and the interface region IFR in the gate-array semiconductor device of FIG. 20.

In FIG. 28, an inverter gate IV1 is provided in the input/output buffer region IOR. The inverter gate IV1 has a PMOS transistor MP3 and an NMOS transistor MN3 connected in series between a supply potential $V_{DD1}$ (the second potential) and the ground potential GND (the third potential).

The body terminals of PMOS transistor MP3 and NMOS transistor MN3 are connected to the respective source terminals, and the gate terminals are connected in common to an input terminal IN. A resistance element R is interposed between a node ND1 joining the PMOS transistor MP3 and the NMOS transistor MN3 and ground potential GND.

Further, an inverter gate IV2 is provided in the interface region IFR. The inverter gate IV2 has a PMOS transistor MP4 and an NMOS transistor MN4 connected in series between a supply potential $V_{DD}$ (the first potential) and the ground potential GND (the third potential).

The body terminals of PMOS transistor MP4 and NMOS transistor MN4 are connected to the respective gate terminals, and the gate terminals are connected in common to the node ND1 of the inverter gate IV1. Accordingly, a faster operation of the PMOS transistor MP4 and the NMOS transistor MN4 is attained.

A node ND2 joining the PMOS transistor MP4 and the NMOS transistor MN4 is connected to the internal transistor region ITR as an output terminal OUT. Furthermore, in all the MOS transistors constituting the internal transistor region ITR, a faster operations is attained by connecting the body terminal to the gate terminal.

<I-2. Operation>

Next, the operation will be discussed, taking a case where the supply potentials $V_{DD1}$ and $V_{DD}$ and the ground potential are 3V, 0.5V and 0V, respectively, as an example.

When a signal of hi-level (the voltage of 3V) is applied to the input terminal IN, the NMOS transistor MN3 turns on and the PMOS transistor MP3 turns off to output a signal of low-level (the voltage of 0V) from the node ND1. Accordingly, in the inverter gate IV2, the PMOS transistor MP4 turns on and the NMOS transistor MN4 turns off to output a signal of hi-level (the voltage of 0.5V) from the output terminal OUT to the internal transistor region ITR.

On the other hand, when a signal of low-level (the voltage of 0V) is applied to the input terminal IN, the PMOS transistor MP3 turns on and the NMOS transistor MN3 turns off. In this case, a voltage set by an ON-resistance of the PMOS transistor MP3 and a resistance value of the resistance element R is outputted from the node ND1.

When the resistance value of the resistance element R is set at 100Ω and the ON-resistance of the PMOS transistor MP3 is set at 500Ω, for example, the signal of hi-level (the voltage of 0.5V) is outputted from the node ND1. Accordingly, in the inverter gate IV2, the PMOS transistor MP4 turns off and the NMOS transistor MN5 turns on to output the signal of low-level (the voltage of 0V) from the output terminal OUT to the internal transistor region ITR.

<I-3. Characteristic Function and Effect>

With the above configuration of the input/output buffer region IOR and the interface region IFR, when the supply potential $V_{DD1}$ of the input/output buffer region IOR is 3V, the input/output buffer region IOR outputs only the voltage ranging from 0 to 0.5V. This voltage is lower than the built-in voltage of a diode constituted of the semiconductor layer to be the body region and the semiconductor layer to be the source region in the PMOS transistor MP4 and the NMOS transistor MN4 in which the body terminals are connected to the gate terminals, and that prevents a parasitic bipolar transistor constituted of the semiconductor layer to be the drain region, the semiconductor layer to be the source region and the semiconductor layer to be the body region from turning on. Thus, it is possible to prevent speeding down the circuit operation.

Providing the interface region IFR between the input/output buffer region IOR and the internal transistor region ITR, which operates with the supply voltage $V_{DD}$ lower than the built-in voltage of the diode, allows coexistence of the semiconductor device operating with the voltage of 5V or 3.3V which is conventionally-used supply voltage and the semiconductor device for faster operation in which the body terminal is connected to the gate terminal.

Furthermore, the input/output buffer region IOR outputs the voltage only ranging from 0 to 0.5V even if an external noise (e.g., the voltage of 4 V or –1V) is applied to the input terminal IN, and has a function of absorbing the external noise. Therefore, it is possible to protect the internal circuit in which the body terminal is connected to the gate terminal, operating with the voltage lower than the built-in voltage.

J. The Ninth Preferred Embodiment

<J-1. Device Construction>

The circuit configuration in which the body terminal is connected to the gate terminal is discussed above in the eighth preferred embodiment taking an example. This circuit configuration may be applied to a MOS transistor serving as an input/output gate of a semiconductor memory device performing read/write operation of data through discharging/charging capacitative element.

Figure 29:
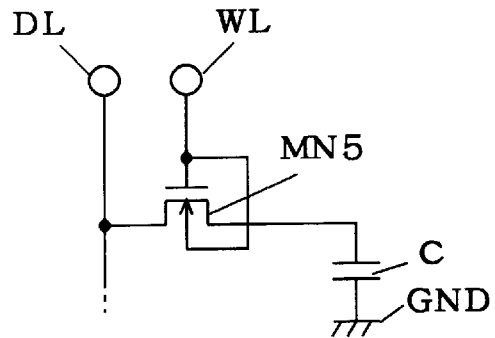
FIG. 29 is a circuit diagram of a ninth preferred embodiment of the present invention.

Specifically, as shown in FIG. 29, in a memory cell having an NMOS transistor MN5 and a capacitative element C (e.g., capacitor) interposed between the source terminal of the NMOS transistor MN5 and the ground potential GND, the body terminal is connected to the gate terminal in the NMOS transistor MN5 to improve the operation speed, resulting in a faster read/write operation of data from/to the capacitative element C.

Furthermore, in read and write operation of data from and to the capacitative element C, a signal of hi-level is applied to a word line terminal WL to turn on the NMOS transistor MN5 and thereby electric charges are discharged out of and charged into the capacitative element C to and from a data line (bit line) terminal DL connected to the drain terminal of NMOS transistor MN5. In storing data, a signal of low-level is applied to the word line terminal WL to turn off the NMOS transistor MN5 and the electric charges accumulated in the capacitative element C are kept.

<J-2. Characteristic Function and Effect>

Thus, with a construction in which the gate terminals and body terminals are connected respectively in the MOS transistors constituting the memory cell, a faster read/write operation is achieved and moreover malfunction due to entrance of α ray of cosmic rays to the semiconductor layers in a turn-on state, i.e., soft error, is prevented since the body terminal is fixed to a constant potential.

To prevent the soft error, the body terminal has only to be fixed to a constant potential. Therefore, connection between the body terminal and the source terminal or drain terminal, as made in the background art, is also effective. To connect the body terminal to the source terminal or drain terminal, however, an additional semiconductor layer to be a body terminal region (contact region) is needed separately from the source region and drain region, which is a hindrance to size-reduction of transistor region.

On the other hand, with the construction to connect the body terminal to the gate terminal in accordance with the first to sixth preferred embodiments, it is possible to eliminate the need for providing the additional semiconductor layer to be a body terminal region separately from the source region and drain region, and size-reduction of transistor region is attained. Therefore, the soft error of the memory cell is prevented and size-reduced memory device can be provided.

K. The Tenth Preferred Embodiment

<K-1. Manufacturing Process for Construction of The First Preferred Embodiment>

Now, a method of manufacturing the construction in which the body terminal is connected to the gate terminal will be discussed below.

Figure 30:
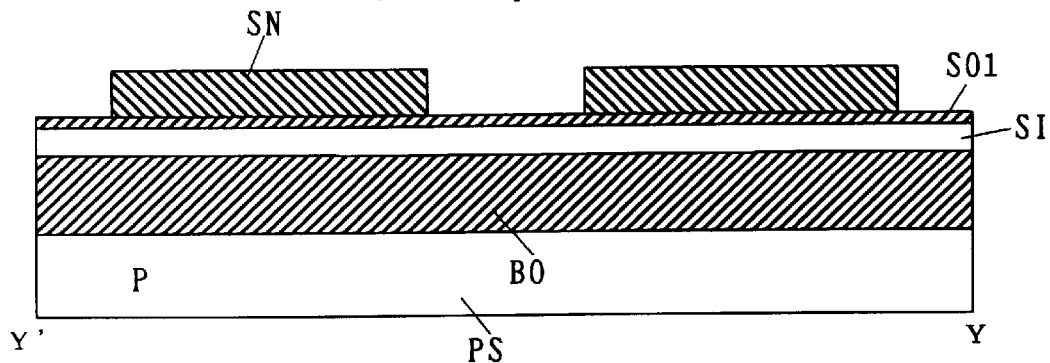
FIGS. 30 to 36 illustrate a process of manufacturing the construction in accordance with the first preferred embodiment of the present invention.

In a process step shown in FIG. 30, the buried oxide film BO is formed inside the P-type silicon substrate PS, and thus the SOI silicon substrate including an SOI layer SI is prepared. The SOI silicon substrate is generally known, like the bulk silicon substrate.

An oxide film SO1 is formed on the SOI layer SI by thermal oxidation. After that, a silicon nitride film SN with an opening of predetermined size is formed by CVD and the like.

Figure 31:
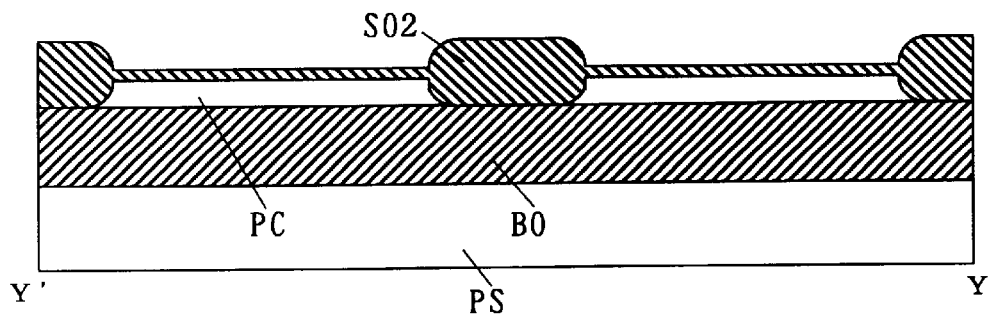

In a process step shown in FIG. 31, an oxide film SO2 is formed by local oxidation using the silicon nitride film SN as a mask and thereafter the silicon nitride film SN is removed. The oxide film SO2 is formed so that its lower surface may reach the buried oxide film BO.

Figure 32:
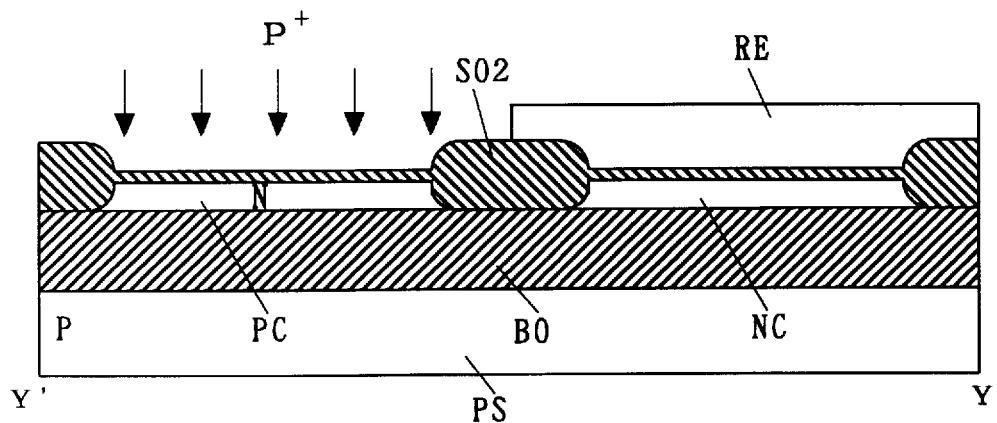

In a process step shown in FIG. 32, a resist RE is applied using photolithography so that only a PMOS transistor region PTR may be exposed, and the PMOS transistor region PTR is implanted with e.g., phosphorus ion (P+) to form the channel region PC of the PMOS transistor.

Figure 33:
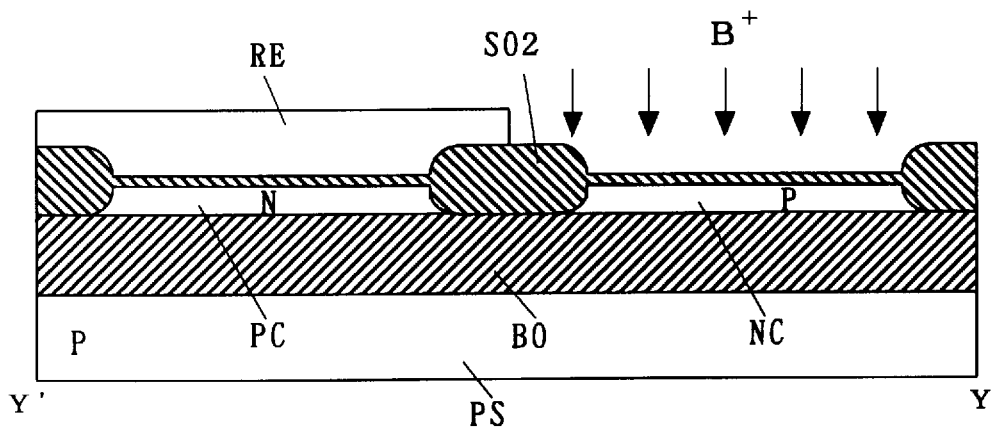

Similarly, in a process step shown in FIG. 33, the resist RE is applied using photolithography so that only an NMOS transistor region may be exposed, and the NMOS transistor region is implanted with e.g., boron ion (B+) to form the channel region NC of the NMOS transistor.

Figure 34:
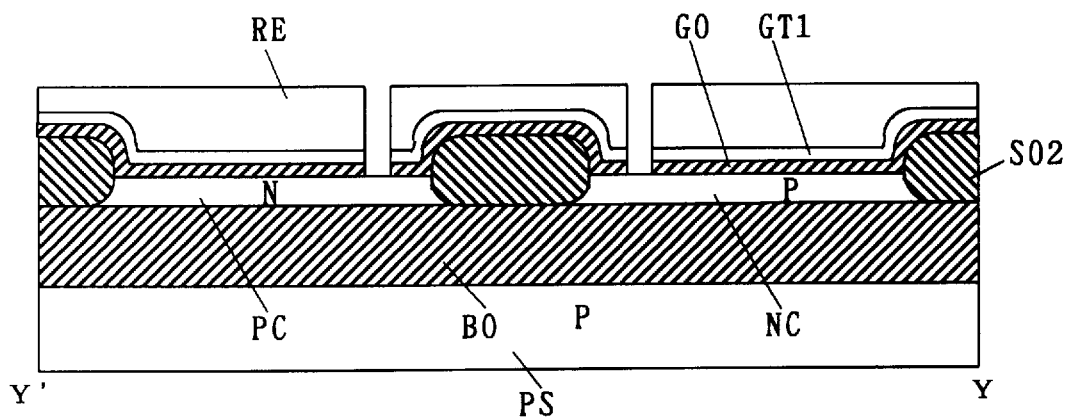

After removing the oxide film (other than the oxide film SO2) on the silicon surface using wet etching, the gate oxide film GO and a gate electrode GT1 are formed in this order. In a process step shown in FIG. 34, the resist RE is applied so that a contact region between the gate electrode GT1 and body region (channel region PC and channel region NC) may be exposed and then the contact region is etched.

Figure 35:
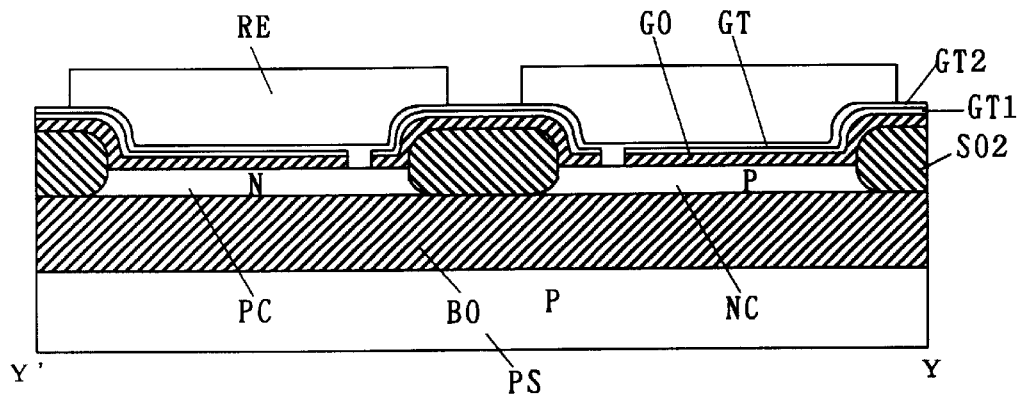

After etching and cleaning the surface of the gate electrode GT1, a gate electrode GT2 is further formed on the gate electrode GT1 and the resist RE is applied according to an eventual shape of the gate electrode in a process step shown in FIG. 35.

Figure 36:
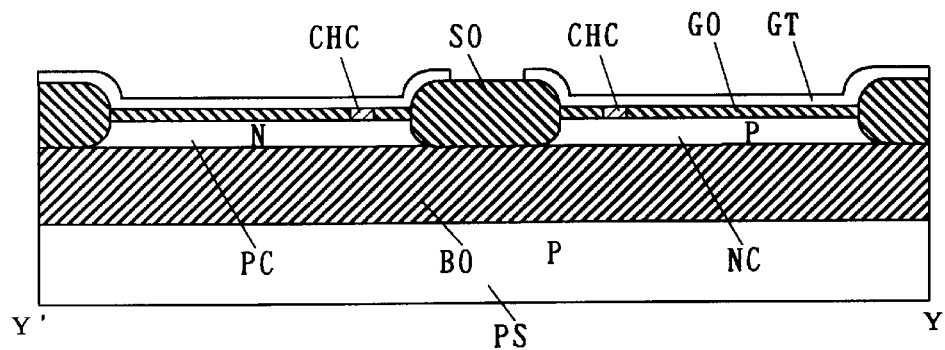

In a process step shown in FIG. 36, the gate electrodes GT1 and GT2 are etched and the resist RE is removed. FIG. 36 is the same as FIG. 22 which is the cross section of the master along the line Y–Y'.

Since the gate electrodes GT1 and GT2 are made of the same material, the two gate electrodes are eventually integrated as the gate electrode GT. The two-step formation of the gate electrode is performed in order to fill the contact hole CHC with the same material as the gate electrode (e.g., polysilicon).

The material to fill the contact hole CHC is not limited to the same material as the gate electrode, and for example, tungsten (W) may be used to fill the contact hole CHC for the purpose of reducing the contact resistance.

<K-2. Manufacturing Process for Construction of The Second Preferred Embodiment>

Figure 37:
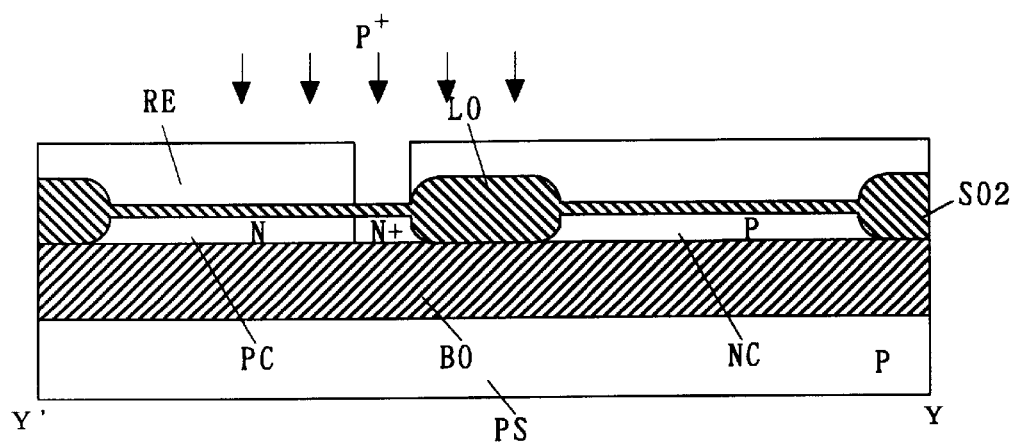
FIG. 37 illustrates a process of manufacturing the construction in accordance with the second preferred embodiment of the present invention.

A method of manufacturing the construction of the second preferred embodiment shown in FIGS. 11 and 12 in which the semiconductor region is adjacent to the channel region is as follows. After the process step of FIG. 33, the resist RE is applied and processed so that a desired region may be exposed and then phosphorus or boron is implanted in a process step of FIG. 37. This is followed by the process steps of FIGS. 34 to 36.

<K-3. Wiring Process>

On the master obtained in the step of FIG. 36, the oxide film LO is so formed as to cover the gate electrode GT and other elements and the resist RE is applied thereon and processed so that a desired region, i.e., an upper portion of the contact hole CHC may be exposed. The oxide film LO is etched to form the contact hole CHB.

Figure 38:
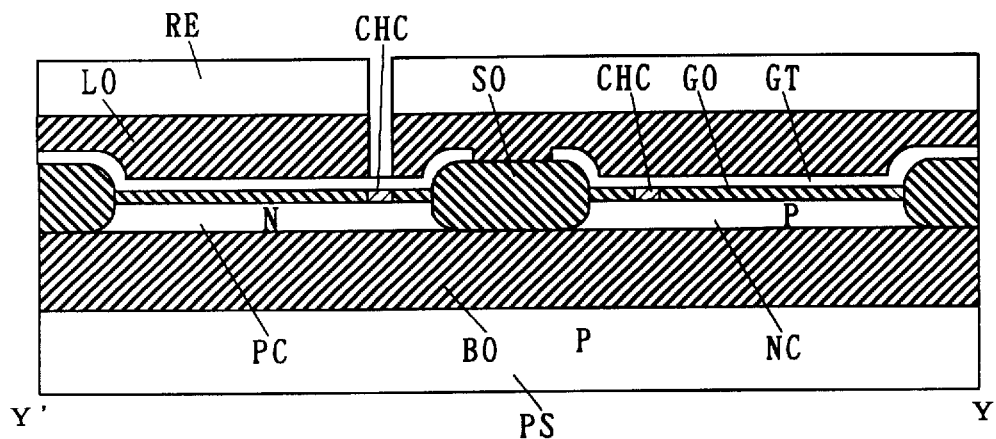
FIGS. 38 and 39 illustrate a wiring process.
Figure 39:
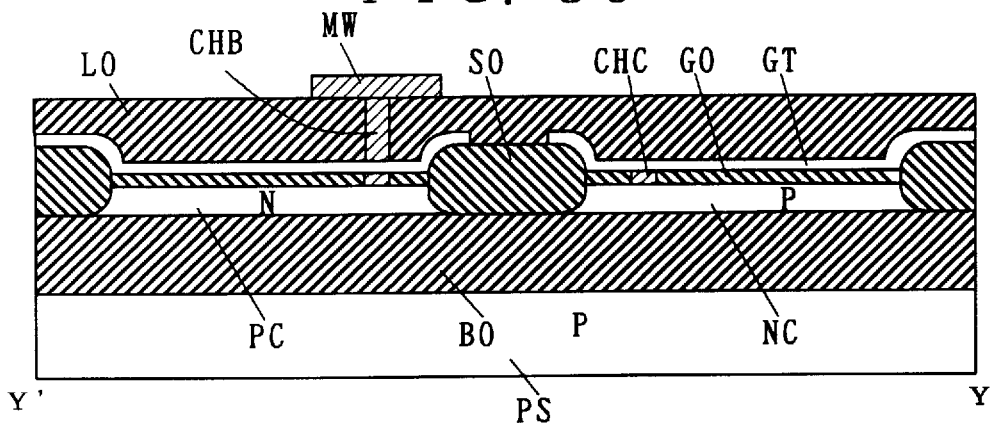

Next, in a process step shown in FIG. 39, tungsten is buried inside the contact hole CHB and the resist RE is removed. After that, the predetermined metal wire MW is placed, thus drawing out the terminals of the transistor. FIG. 38 shows a wiring for the gate terminal.

<K-4. Manufacturing Process for Construction of The Third Preferred Embodiment>

A method of manufacturing the construction of the third preferred embodiment shown in FIGS. 14 and 15 in which the contact hole is included in the oxide film which is thicker than the gate oxide film will be described below.

Figure 40:
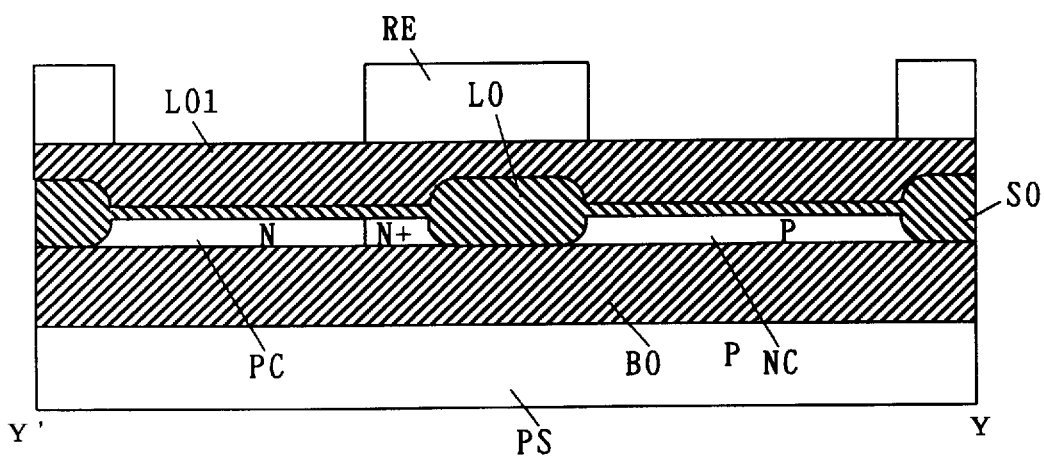
FIGS. 40 to 45 illustrate a process of manufacturing the construction in accordance with the third preferred embodiment of the present invention.

After the step of FIG. 33, an oxide film LO1 is formed and the resist RE is applied thereon and processed so that a desired opening may be obtained in a process step shown in FIG. 40.

Figure 41:
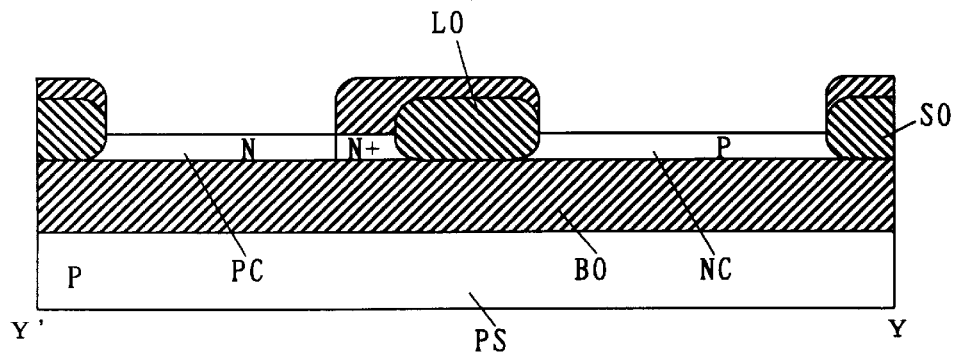

Subsequently, in a process step shown in FIG. 41, the oxide film LO1 and the oxide film SO1 are selectively etched to expose the channel regions PC and NC. In FIG. 41, the oxide film LO1 and the oxide film SO1 are integrated.

Figure 42:
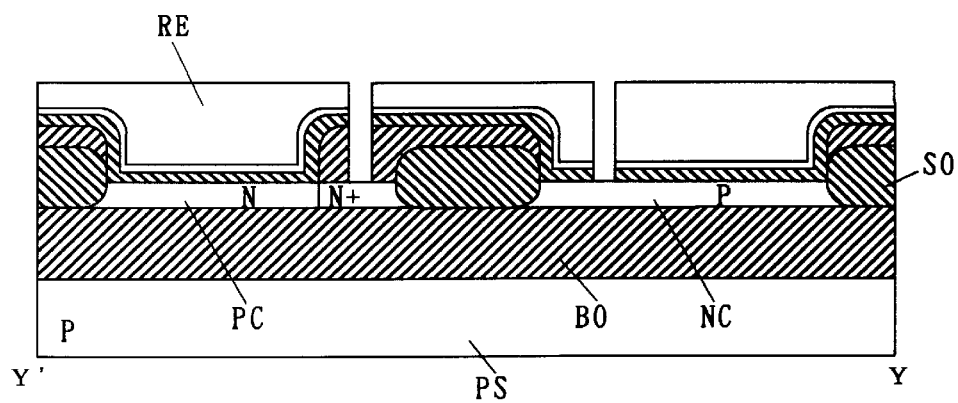

In a process step shown in FIG. 42, the gate oxide film GO and the gate electrode GT1 are formed in this order, and the resist RE is applied so that a contact region between the gate electrode GT1 and the body region (N$^+$-type semiconductor region NP and the channel region NC) may be exposed and the contact region is etched.

Figure 43:
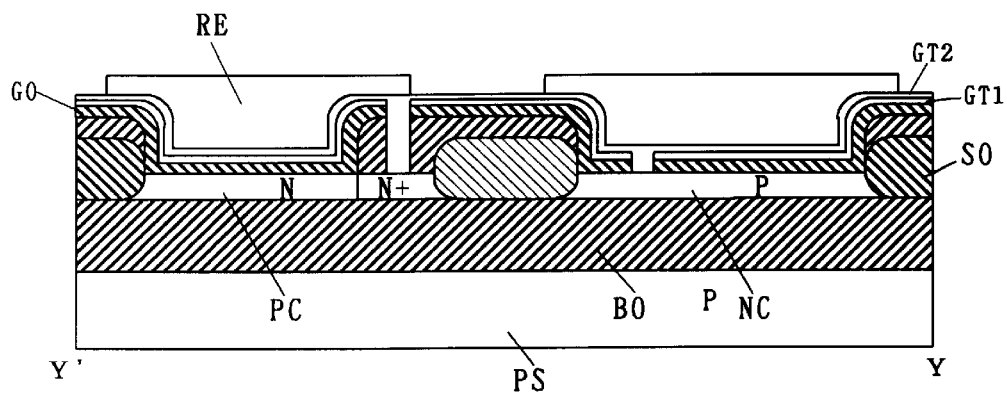

After etching and cleaning the surface of the gate electrode GT1, the gate electrode GT2 is formed on the gate electrode GT1 and the resist RE is applied according to the eventual shape of the gate electrode in a process step shown in FIG. 43.

Figure 44:
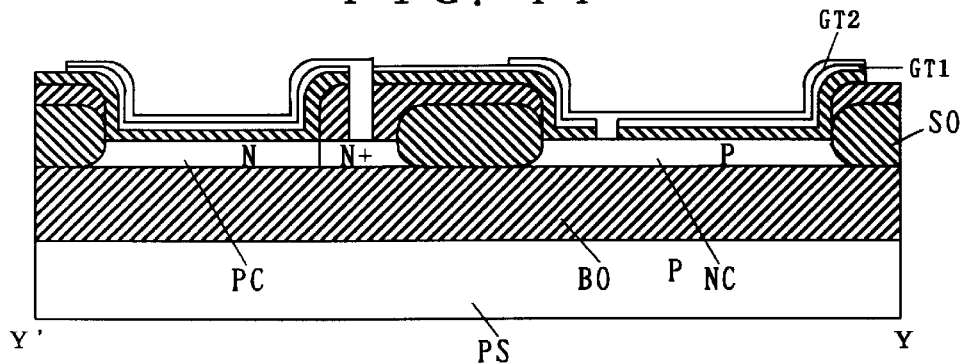

In a process step shown in FIG. 44, the gate electrodes GT1 and GT2 are etched and the resist RE is removed.

Figure 45:
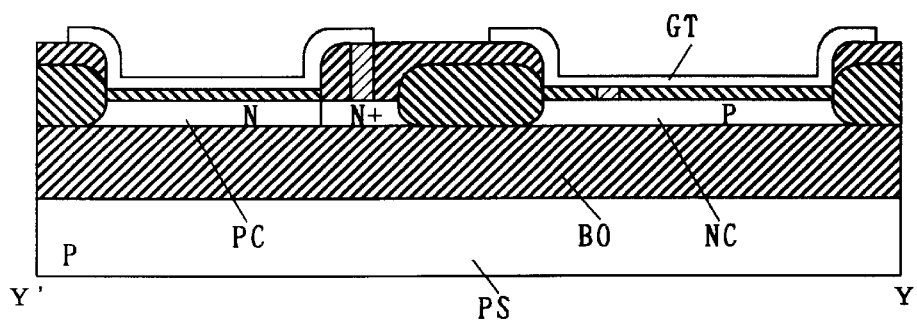

At last, in a process step shown in FIG. 45, the oxide film LO is so formed as to cover the gate electrode GT and other elements. Since the gate electrodes GT1 and GT2 are made of the same material, the two gate electrodes are eventually integrated as the gate electrode GT.

<K-5. Manufacturing Process for Construction using Bulk Silicon Substrate>

As a method of manufacturing the construction using the bulk silicon substrate, a method of manufacturing the master with oxide-film isolated structure of FIG. 24 will be discussed.

Figure 46:
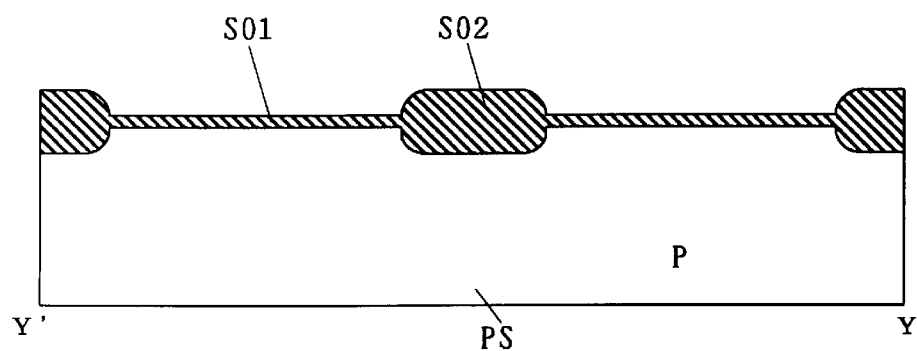
FIGS. 46 to 52 illustrate a process of manufacturing a gate-array semiconductor device with oxide-film isolated structure having the construction of the present invention.

In a process step shown in FIG. 46, the oxide film SO1 is formed on the bulk silicon substrate PS using thermal oxidation, and thereafter the oxide film SO2 is formed using local oxidation.

Figure 47:
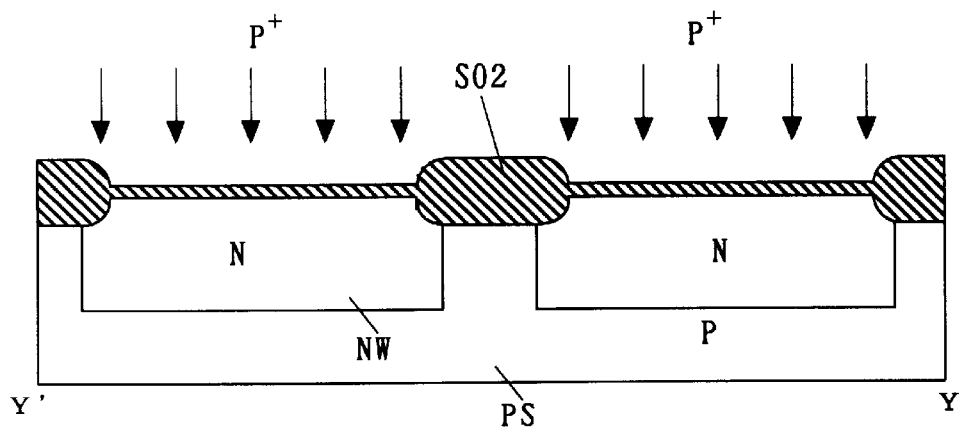

In a process step shown in FIG. 47, phosphorus ion is selectively implanted to form the N-type well region NW of PMOS transistor.

Figure 48:
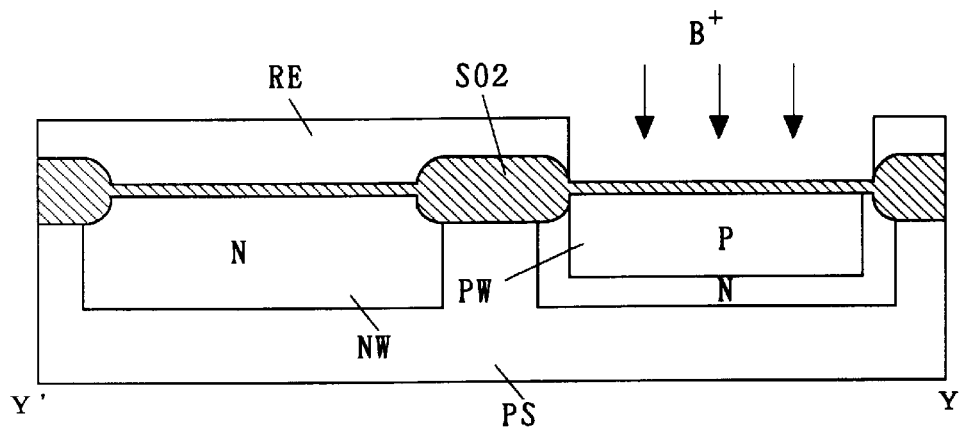

Similarly, in a process step shown in FIG. 48, boron ion, for example, is selectively implanted using photolithography to form the P-type well region PW of NMOS transistor. This step is performed in order to isolate the P-type well region PW of the NMOS transistor from the bulk silicon substrate PS and P-type wells of other NMOS transistors since the bulk silicon substrate PS has no buried oxide film, unlike the SOI substrate.

Figure 49:
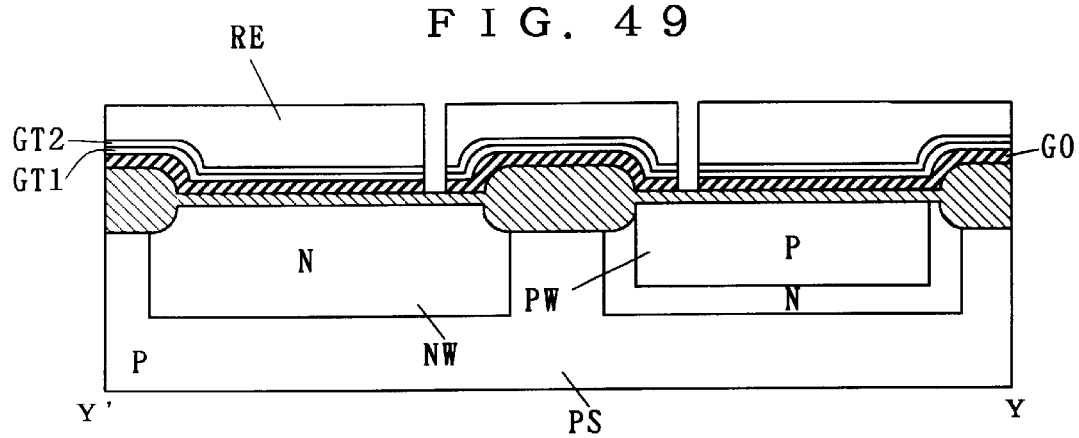

In a process step shown in FIG. 49, the resist RE is applied so that the contact region between the gate electrode GT1 and the body region (N-type well region NW and P-type well region PW) may be exposed and then the contact region is etched.

Figure 50:
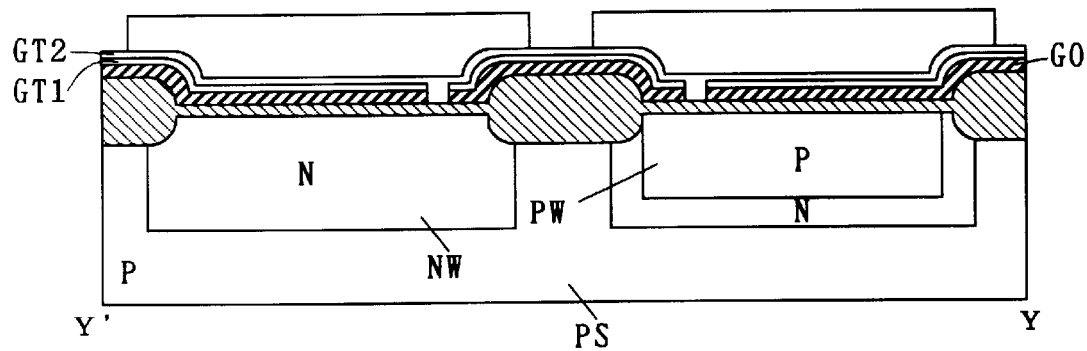

After etching and cleaning the surface of the gate electrode GT1, the gate electrode GT2 is formed on the gate electrode GT1 and the resist RE is applied according to the eventual shape of the gate electrode in a process step shown in FIG. 50.

Figure 51:
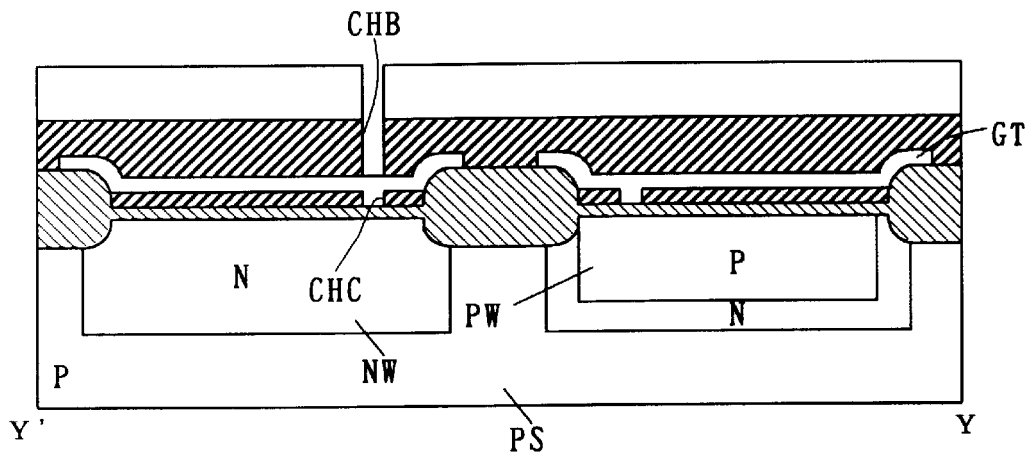

In a process step shown in FIG. 51, the gate electrodes GT1 and GT2 are etched to remove the resist RE, and thereafter the oxide film LO is so formed as to cover the gate electrode GT and other elements and the resist RE is applied thereon and processed so that a desired region, i.e., the upper portion of the contact hole CHC may be exposed. The oxide film LO is etched to form the contact hole CHB.

Figure 52:
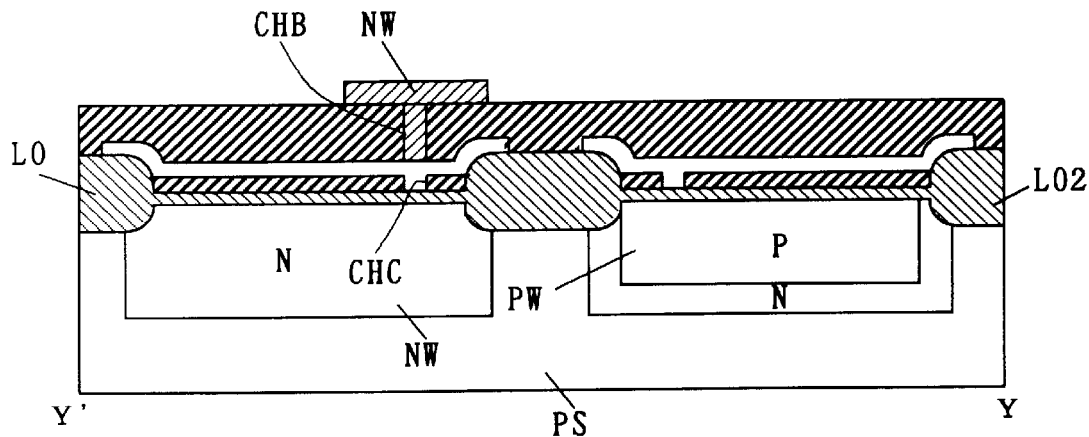
Figure 53:
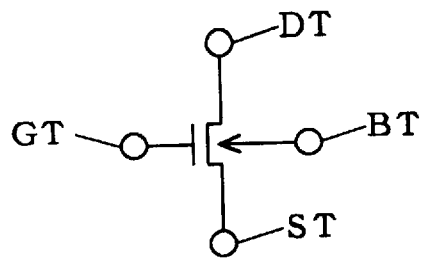
FIG. 53 illustrates a terminal layout of an NMOS transistor.
Figure 54:
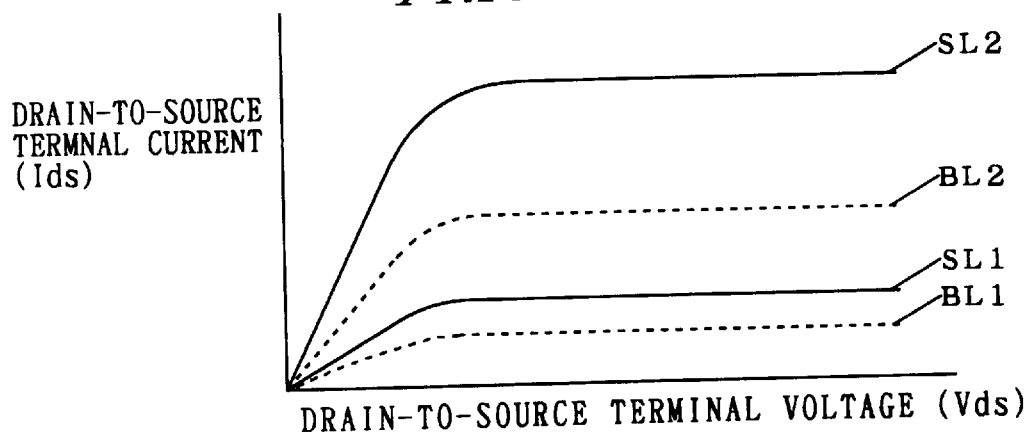
FIG. 54 is a graph showing operating characteristics of the NMOS transistor.

Next, in a process step shown in FIG. 52, tungsten is buried inside the contact hole CHB and the resist RE is removed. After that, the predetermined metal wire MW is placed, thus drawing out the terminals of the transistor. FIG. 52 shows a wiring for the gate terminal.

While the invention has been shown and described in detail, the foregoing description is in all aspects illustrative and not restrictive. It is therefore understood that numerous modifications and variations can be devised without departing from the scope of the invention.

I claim:

1. A semiconductor device with MOS structure, comprising:
    a semiconductor layer to be a channel region;
    a first oxide film to be a gate oxide film provided on said semiconductor layer;
    a gate electrode provided so that at least a portion thereof may be disposed on said first oxide film; and
    first connecting means provided between said gate electrode and said semiconductor layer, for electrically connecting said gate electrode and said semiconductor layer,
    wherein said first connecting means has
        a first contact hole provided so as to penetrate said first oxide film between said gate electrode and said semiconductor layer and thereby direct couple a lower main surface of said gate electrode and said semiconductor layer; and
        a first conductor layer filling said first contact hole.

2. The semiconductor device of claim 1, wherein said first conductor layer is made of the same material as said gate electrode.

3. The semiconductor device of claim 1, wherein said first conductor layer is made of a material different from that of said gate electrode.

4. A semiconductor device with MOS structure, comprising:
    a first semiconductor layer to be a channel region;
    a second semiconductor layer provided adjacently to said first semiconductor layer, having a relatively high concentration and the same conductivity type as said first semiconductor layer;

a first oxide film provided at least on said first semiconductor layer, to be a gate oxide film;

a gate electrode provided on said first oxide film so that at least a portion thereof may be disposed on said first oxide film; and first connecting means provided between said gate electrode and said second semiconductor layer, for electrically connecting said gate electrode and said second semiconductor layer, wherein said first connecting means has
a first contact hole provided so as to direct couple a lower main surface of said gate electrode and said second semiconductor layer, and
a first conductor layer filling said first contact hole.

5. The semiconductor device of claim 4, wherein
said first oxide film is provided over said first semiconductor layer and said second semiconductor layer, and
said first contact hole is provided so as to penetrate said first oxide film between said gate electrode and said second semiconductor layer.

6. The semiconductor device of claim 4, further comprising:
a second oxide film provided on said second semiconductor layer adjacently to said first oxide film, being thicker than said first oxide film,
wherein said gate electrode is provided so that most portion thereof may be disposed on said first oxide film and the remaining portion may be disposed on said second oxide film, and
said first contact hole is provided so as to penetrate said second oxide film between said gate electrode and said second semiconductor layer.

7. The semiconductor device of claim 4, wherein
said first conductor layer is made of the same material as said gate electrode.

8. The semiconductor device of claim 4, wherein
said first conductor layer is made of a material different from that of said gate electrode.

9. The semiconductor device of claim 4, further comprising:
an insulation layer provided so as to cover said gate electrode;
a wiring layer provided on said insulation layer; and
second connecting means provided between said wiring layer and said gate electrode, for electrically connecting said wiring layer and said gate electrode,
wherein said second connecting means has
a second contact hole provided so as to direct couple said wiring layer and said gate electrode, and
a second conductor layer filling said second contact hole,
and wherein said gate electrode has an engagement portion to be engaged with said first contact hole which is wider than other portion, and
said second contact hole is provided so as to penetrate said insulation layer, extending from a surface of said wiring layer to a surface of said engagement portion of said gate electrode which is opposite to that in engagement with the first contact hole.

10. The semiconductor device of claim 4,
said semiconductor device with MOS structure being used for a gate-array semiconductor device, wherein said gate-array semiconductor device includes
a first array consisting of a plurality of MOS transistors of a first conductivity type in which gate electrodes of said plurality of MOS transistors of the first conductivity type are aligned in parallel,
a second array consisting of a plurality of MOS transistors of a second conductivity type in which gate electrodes of said plurality of MOS transistors of the second conductivity type are aligned in parallel, and
an isolation layer provided between said first array and said second array which are adjacent to each other, for electrically isolating said first and second arrays, and wherein
said first connecting means is provided for each of all said gate electrodes of said MOS transistors of the first conductivity type and said MOS transistors of the second conductivity type.

11. The semiconductor device of claim 4,
said semiconductor device with MOS structure being used for a gate-array semiconductor device,
wherein said gate-array semiconductor device includes
a first array consisting of a plurality of MOS transistors of a first conductivity type in which gate electrodes of said plurality of MOS transistors of the first conductivity type are aligned in parallel,
a second array consisting of a plurality of MOS transistors of a second conductivity type in which gate electrodes of said plurality of MOS transistors of the second conductivity type are aligned in parallel,
a first isolation layer provided between said first array and said second array which are adjacent to each other, for electrically isolating said first and second arrays, and
a second isolation layer for electrically isolating adjacent two of said MOS transistors of the first conductivity type and adjacent two of said MOS transistors of the second conductivity type, and wherein
said first connecting means is provided for each of all said gate electrodes of said MOS transistors of the first conductivity type and said MOS transistors of the second conductivity type.

12. The semiconductor device of claim 4,
said semiconductor device with MOS structure being used for data processing means for processing data externally given and data transmitting means electrically interposed between said data processing means and input/output means for inputting said data externally given and outputting data processed by said data processing means,
wherein said data processing means and said data transmitting means use a first voltage as an operating supply voltage as an operating supply voltage which is lower than a built-in voltage of a parasitic diode caused by providing said first connecting means, and
said input/output means uses a second voltage as the operating supply voltage which is equal to or higher than said built-in voltage of said parasitic diode.

13. The semiconductor device of claim 4,
said semiconductor device with MOS structure being used for an input/output gate of a semiconductor device which performs read/write operation of data through discharge/charge of capacitative elements.

14. A semiconductor device with MOS structure, comprising:
a) a semiconductor layer to be a channel region;
b) a first oxide film to be a gate oxide film provided on said semiconductor layer;

c) a gate electrode provided so that at least a portion thereof may be disposed on said first oxide film;
d) first connecting means provided between said gate electrode and said semiconductor layer, for electrically connecting said gate electrode and said semiconductor layer, wherein said first connecting means has
   i) a first contact hole provided so as to direct couple a lower main surface of said gate electrode and said semiconductor layer; and
   ii) a first conductor layer filling said first contact hole; and
e) a second oxide film provided on said semiconductor layer adjacently to said first oxide film, being thicker than said first oxide film;
f) wherein said gate electrode is provided so that most portion thereof may be disposed on said first oxide film and the remaining portion may be disposed on said second oxide film; and
g) wherein said first contact hole is provided so as to penetrate said second oxide film between said gate electrode and said semiconductor layer.

15. A semiconductor device with MOS structure, comprising:
a) a semiconductor layer to be a channel region;
b) a first oxide film to be a gate oxide film provided on said semiconductor layer;
c) a gate electrode provided so that at least a portion thereof may be disposed on said first oxide film;
d) first connecting means provided between said gate electrode and said semiconductor layer, for electrically connecting said gate electrode and said semiconductor layer, wherein said first connecting means has
   i) a first contact hole provided so as to direct couple a lower main surface of said gate electrode and said semiconductor layer; and
   ii) a first conductor layer filling said first contact hole;
e) an insulation layer provided so as to cover said gate electrode;
f) a wiring layer provided on said insulation layer;
g) second connecting means provided between said wiring layer and said gate electrode for electrically connecting said wiring layer and said gate electrode, wherein said second connecting means has
   i) a second contact hole provided so as to direct couple said wiring layer and said gate electrode, and
   ii) a second conductor layer filling said second contact hole;
h) wherein said gate electrode has an engagement portion to be engaged with said first contact hole which is wider than other portion; and
i) wherein said second contact hole is provided so as to penetrate said insulation layer, extending from a surface of said wiring layer to a surface of said engagement portion of said gate electrode which is opposite to that in engagement with the first contact hole.

16. A semiconductor device with MOS structure, comprising:
a) a semiconductor layer to be a channel region;
b) a first oxide film to be a gate oxide film provided on said semiconductor layer;
c) a gate electrode provided so that at least a portion thereof may be disposed on said first oxide film;
d) first connecting means provided between said gate electrode and said semiconductor layer, for electrically connecting said gate electrode and said semiconductor layer, wherein said first connecting means has
   i) a first contact hole provided so as to direct couple a lower main surface of said gate electrode and said semiconductor layer; and
   ii) a first conductor layer filling said first contact hole; and
e) said semiconductor device with MOS structure being used for a gate-array semiconductor device, wherein said gate-array semiconductor device includes
   i) a first array consisting of a plurality of MOS transistors of a first conductivity type in which gate electrodes of said plurality of MOS transistors of the first conductivity type are aligned in parallel;
   ii) a second array consisting of a plurality of MOS transistors of a second conductivity type in which gate electrodes of said plurality of MOS transistors of the second conductivity type are aligned in parallel;
   iii) an isolation layer provided between said first array and said second array which are adjacent to each other, for electrically isolating said first and second arrays; and
   iv) wherein said first connecting means is provided for each of said gate electrodes of said MOS transistors of the first conductivity type and said MOS transistors of the second conductivity type.

17. A semiconductor device with MOS structure, comprising:
a) a semiconductor layer to be a channel region;
b) a first oxide film to be a gate oxide film provided on said semiconductor layer;
c) a gate electrode provided so that at least a portion thereof may be disposed on said first oxide film;
d) first connecting means provided between said gate electrode and said semiconductor layer, for electrically connecting said gate electrode and said semiconductor layer, wherein said first connecting means has
   i) a first contact hole provided so as to direct couple a lower main surface of said gate electrode and said semiconductor layer; and
   ii) a first conductor layer filling said first contact hole; and
e) said semiconductor device with MOS structure being used for a gate-array semiconductor device, wherein said gate-array semiconductor device includes
   i) a first array consisting of a plurality of MOS transistors of a first conductivity type in which gate electrodes of said plurality of MOS transistors of the first conductivity type are aligned in parallel;
   ii) a second array consisting of a plurality of MOS transistors of a second conductivity type in which gate electrodes of said plurality of MOS transistors of the second conductivity type are aligned in parallel;
   iii) a first isolation layer provided between said first array and said second array which are adjacent to each other, for electrically isolating said first and second arrays;
   iv) a second isolation layer for electrically isolating adjacent two of said MOS transistors of the first conductivity type and adjacent two of said MOS transistors of the second conductivity type; and
   v) wherein said first connecting means is provided for each of said gate electrodes of said MOS transistors of the first conductivity type and said MOS transistors of the second conductivity type.

18. A semiconductor device with MOS structure, comprising:
- a) a semiconductor layer to be a channel region;
- b) a first oxide film to be a gate oxide film provided on said semiconductor layer;
- c) a gate electrode provided so that at least a portion thereof may be disposed on said first oxide film;
- d) first connecting means provided between said gate electrode and said semiconductor layer, for electrically connecting said gate electrode and said semiconductor layer, wherein said first connecting means has
  - i) a first contact hole provided so as to direct couple a lower main surface of said gate electrode and said semiconductor layer; and
  - ii) a first conductor layer filling said first contact hole;
- e) said semiconductor device with MOS structure being used for data processing means for processing data externally given and data transmission means electrically interposed between said data processing means and input/output means for inputting said data externally given and outputting data processed by said data processing means;
- f) wherein said data processing means and said data transmitting means use a first voltage as an operating supply voltage which is lower than a built-in voltage of a parasitic diode caused by provision of said first connecting means; and
- g) said input/output means uses a second voltage as the operating supply voltage which is equal to or higher than said built-in voltage of said parasitic diode.

19. A semiconductor device with MOS structure, comprising:
- a) a semiconductor layer to be a channel region;
- b) a first oxide film to be a gate oxide film provided on said semiconductor layer;
- c) a gate electrode provided so that at least a portion thereof may be disposed on said first oxide film;
- d) first connecting means provided between said gate electrode and said semiconductor layer, for electrically connecting said gate electrode and said semiconductor layer, wherein said first connecting means has
  - i) a first contact hole provided so as to direct couple a lower main surface of said gate electrode and said semiconductor layer; and
  - ii) a first conductor layer filling said first contact hole; and
- e) said semiconductor device with MOS structure being used for an input/output gate of a semiconductor device which performs read/write operation of data through discharge/charge of capacitative elements.

* * * * *